(12) United States Patent
Goto et al.

(10) Patent No.: US 8,703,618 B2
(45) Date of Patent: Apr. 22, 2014

(54) METHOD OF FORMING MICROPATTERN, DIE FORMED BY THIS METHOD OF FORMING MICROPATTERN, TRANSFER METHOD AND MICROPATTERN FORMING METHOD USING THIS DIE

(75) Inventors: Hiroshi Goto, Shizuoka-Ken (JP); Hiroshi Okuyama, Shizuoka-Ken (JP); Mitsunori Kokubo, Shizuoka-Ken (JP); Kentaro Ishibashi, Shizuoka-Ken (JP)

(73) Assignee: Toshiba Kikai Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/555,728

(22) Filed: Jul. 23, 2012

(65) Prior Publication Data

US 2012/0286450 A1 Nov. 15, 2012

Related U.S. Application Data

(62) Division of application No. 12/530,134, filed as application No. PCT/JP2008/054082 on Mar. 6, 2008, now Pat. No. 8,247,330.

(30) Foreign Application Priority Data

Mar. 8, 2007 (JP) .................. 2007-059016
Jan. 17, 2008 (JP) .................. 2008-008011

(51) Int. Cl.
*H01L 21/311* (2006.01)
(52) U.S. Cl.
USPC .............. 438/703; 438/734; 257/E21.214; 216/52

(58) Field of Classification Search
USPC ............................................. 438/946; 264/496
See application file for complete search history.

(56) References Cited

U.S. PATENT DOCUMENTS

| 6,818,139 | B1 | 11/2004 | Lee et al. |
| 2004/0124566 | A1* | 7/2004 | Sreenivasan et al. ......... 264/494 |
| 2005/0159019 | A1 | 7/2005 | Lee |
| 2006/0144275 | A1 | 7/2006 | Kolesnychenko et al. |

FOREIGN PATENT DOCUMENTS

| JP | 11-245234 | 9/1999 |
| JP | 2001-198979 | 7/2001 |
| JP | 2005-203797 | 7/2005 |
| JP | 2005-302453 | 10/2005 |
| JP | 2006-191089 | 7/2006 |
| JP | 2008-044289 | 2/2008 |
| WO | WO 2005/022208 | 3/2005 |

OTHER PUBLICATIONS

B.J. Choi et al., "Design of Orientation Stages for Step and Flash Imprint Lithography", Precision Engineering, Journal of the International Societies for Precision Engineering and nanotechnology, vol. 21, pp. 192-199 (2001).
International Search Report issued in International Application No. PCT/JP2008/054082, mailed Apr. 22, 2008.

(Continued)

*Primary Examiner* — Daniel Whalen
*Assistant Examiner* — Shaka White
(74) *Attorney, Agent, or Firm* — DLA Piper LLP (US)

(57) ABSTRACT

A micropattern is joined to a substrate (W1) by: a first group of covering step and micropattern forming step by etching in a transfer step; and a second group of covering step and micropattern forming step by etching in the transfer step.

11 Claims, 21 Drawing Sheets

(56) References Cited

OTHER PUBLICATIONS

English translation of International Search Report issued in International Application No. PCT/JP2008/054082, mailed Apr. 22, 2008.
Written Opinion issued in International Application No. PCT/JP2008/054082, mailed Apr. 22, 2008.
English language abstract of JP 2006-144275, published Jul. 20, 2006.
Machine English language translation of JP 2006-144275, published Jul. 20, 2006.
English language abstract of JP 2001-198979, published Jul. 24, 2001.
Machine English language translation of JP 2001-198979, published Jul. 24, 2001.
English language abstract of JP 2005-203797, published Jul. 28, 2005.
Machine English language translation of JP 2005-203797, published Jul. 28, 2005.
English language abstract of JP 2005-302453, published Oct. 27, 2005.
Machine English language translation of JP 2005-302453, published Oct. 27, 2005.
English language abstract of JP 11-245234, published Sep. 14, 1999.
Machine English language translation of JP 11-245234, published Sep. 14, 1999.
English language abstract of JP 2008-044289, published Feb. 28, 2008.
Machine English language translation of JP 2008-044289, published Feb. 28, 2008.
Office Action issued in Swedish Patent Application No. 0950640-3, mailed Jun. 28, 2010.
English language translation of Office Action issued in Swedish Patent Application No. 0950640-3, mailed Jun. 28, 2010.
Korean Office Action issued in KR 10-2009-7018646 on May 23, 2011.
English Language Translation of Korean Office Action issued in KR 10-2009-7018646 on May 23, 2011.
Taiwanese Office Action issued in TW 097108132 on Jul. 11, 2011.
English Language Translation of Taiwanese Office Action issued in TW 097108132 on Jul. 11, 2011.
Japanese Office Action issued in JP 2008-008011 on Feb. 21, 2012.
Partial English Language Translation of Japanese Office Action issued in JP 2008-008011 on Feb. 21, 2012.
English Language Abstract of WO2005/022208 published on Mar. 10, 2005.
Image File Wrapper of U.S. Appl. No. 12/530,134 electronically captured Nov. 21, 2012 (Now U.S. Patent 8,247,330 issued Aug. 21, 2012).
Image File Wrapper of U.S. Appl. No. 13/555,768 electronically captured Nov. 21, 2012.
Image File Wrapper of U.S. Appl. 13/555,781 electronically captured Nov. 21, 2012.
Image File Wrapper of U.S. Appl. No. 13/555,768 electronically captured Oct. 4, 2013.
Image File Wrapper of U.S. Appl. No. 13/555,781 electronically captured Oct. 4, 2013.
Partial Image File Wrapper of U.S. Appl. No. 13/555,768 electronically captured Feb. 12, 2014 between Nov. 12, 2013 and Feb. 12, 2014.
Partial Image File Wrapper of U.S. Appl. No. 13/555,781 electronically captured Feb. 12, 2014 between Nov. 12, 2013 and Feb. 12, 2014.

* cited by examiner

FIG. 4
(a)
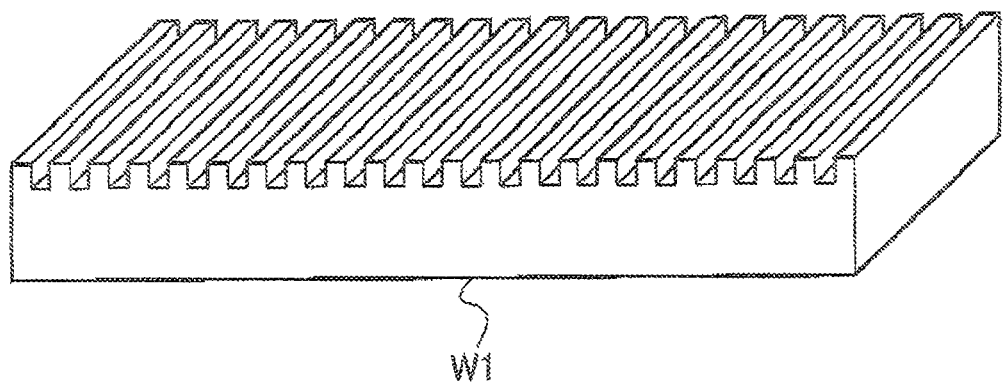
W1
(b)
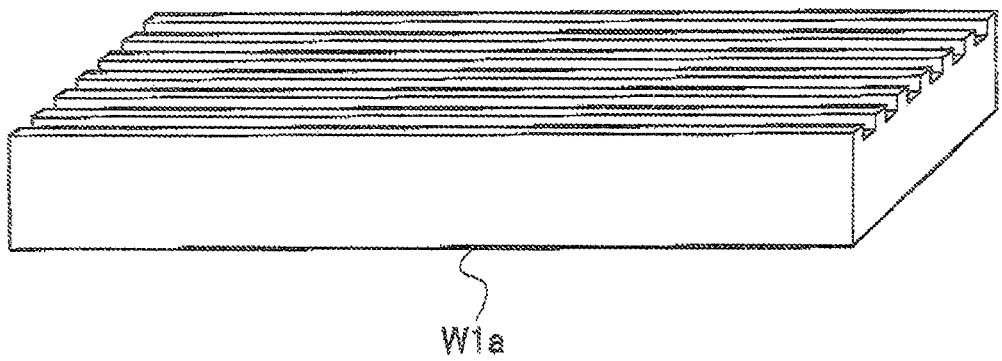
W1a

FIG. 5
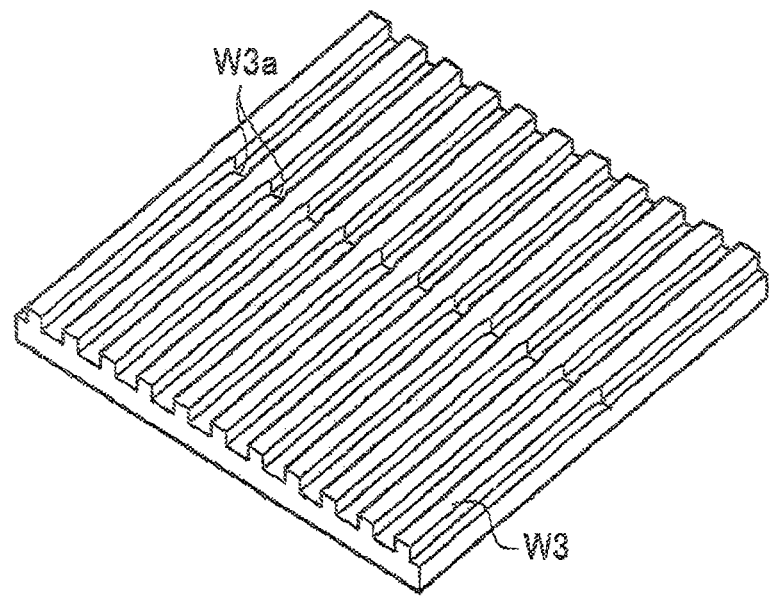
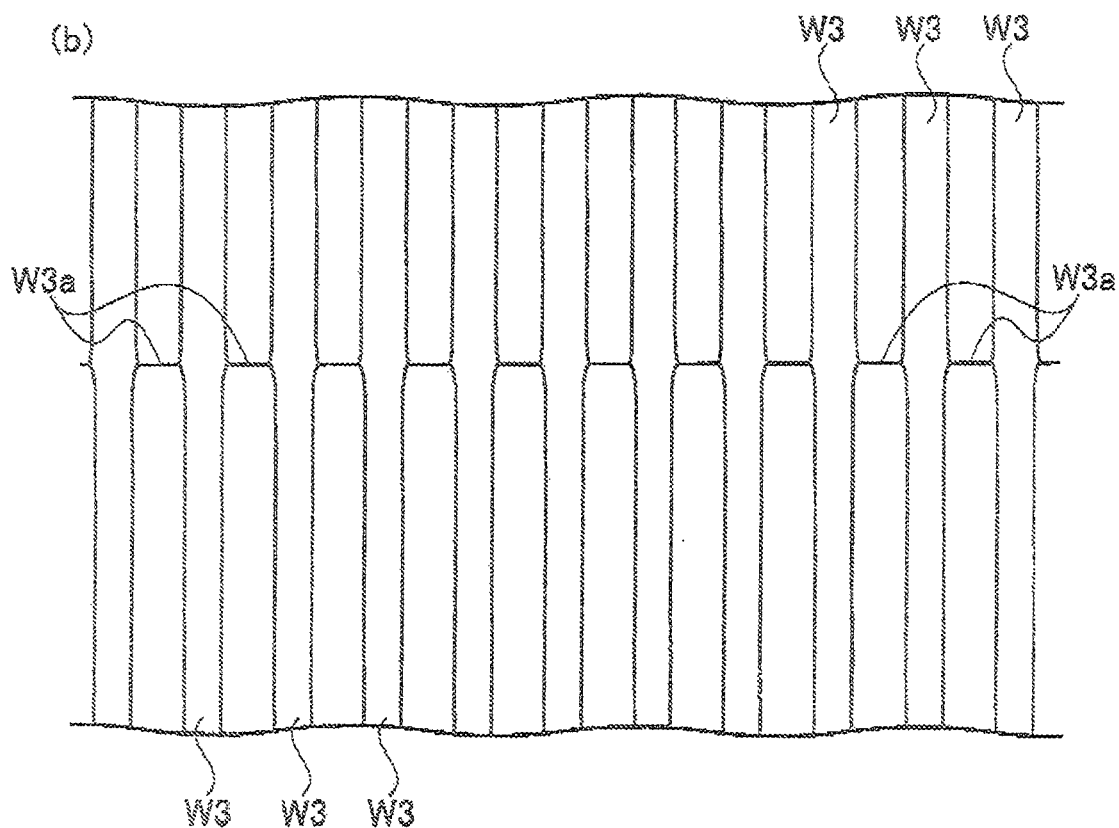

FIG. 7
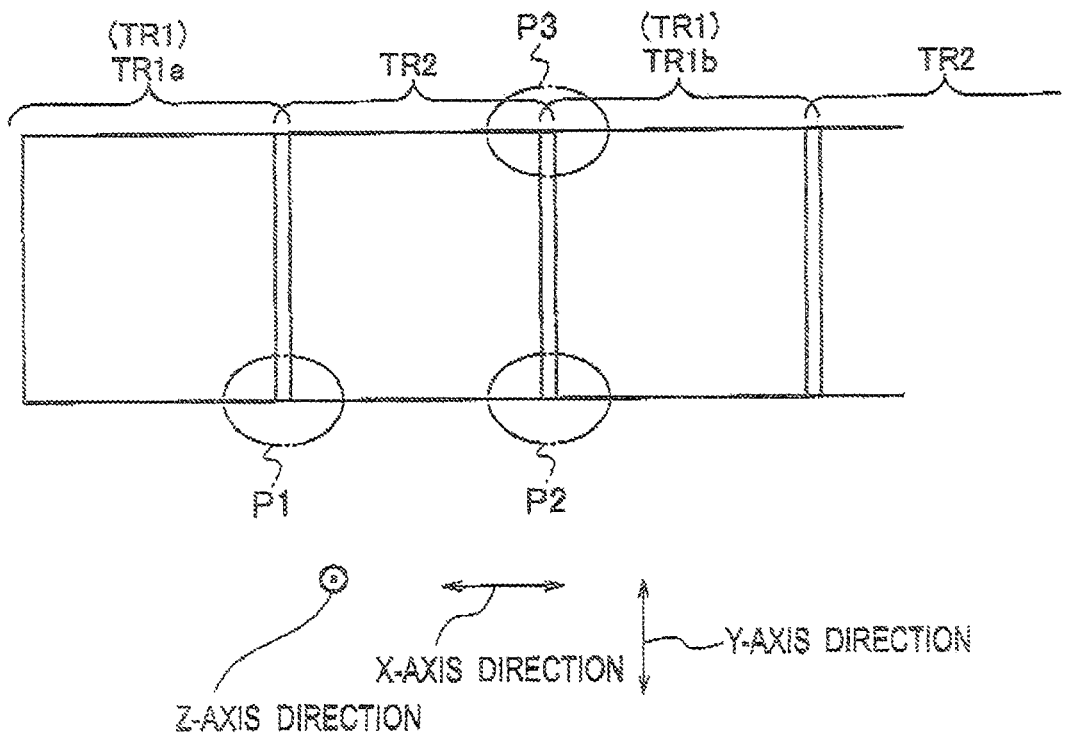
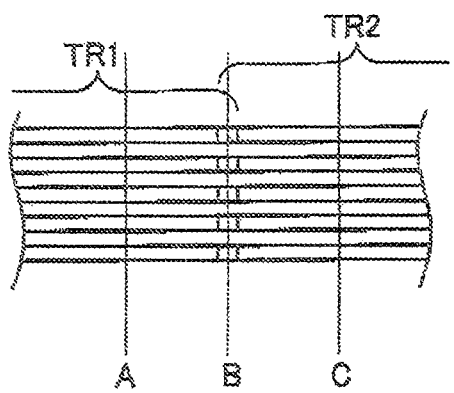

FIG. 8
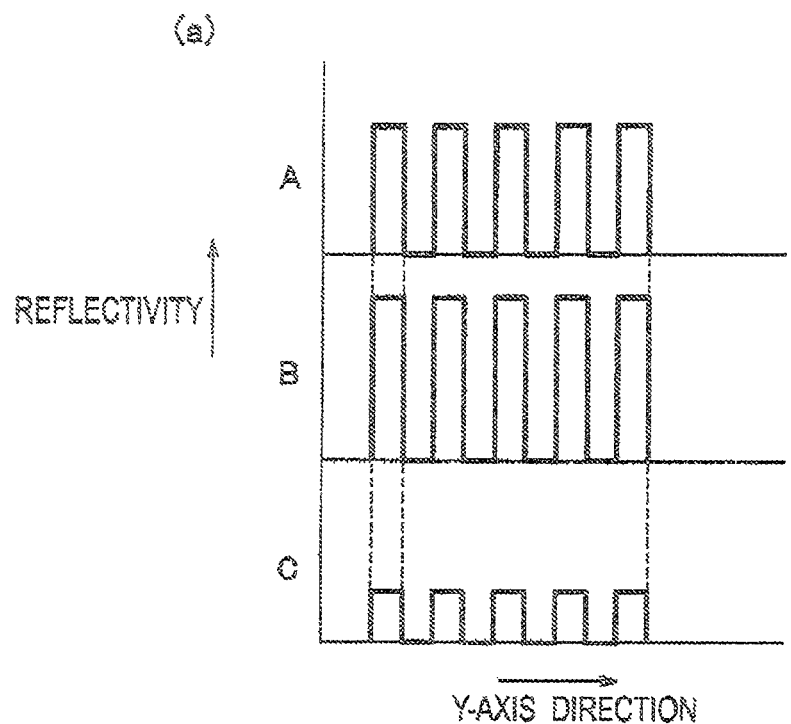
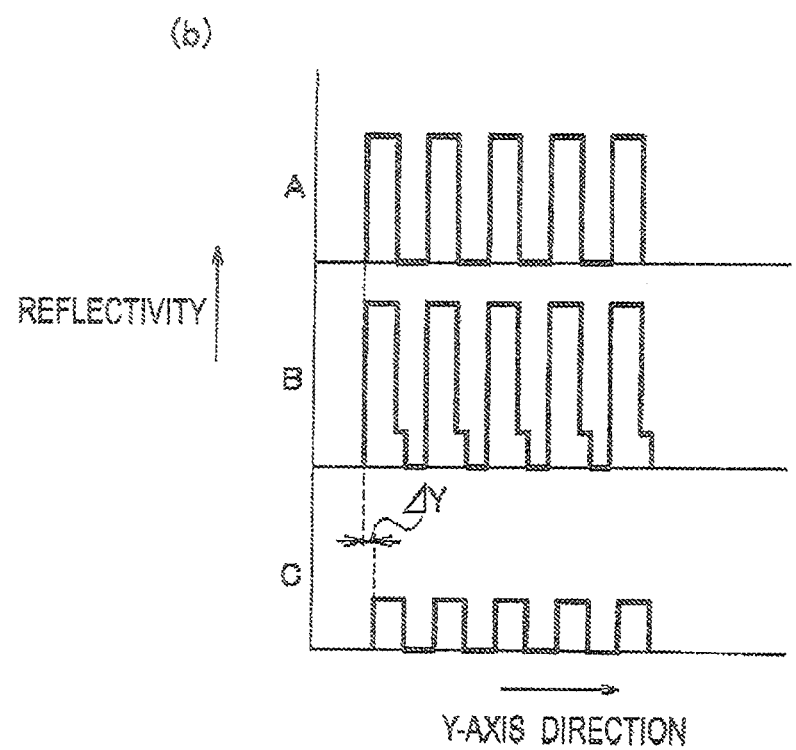

FIG. 9
(a)
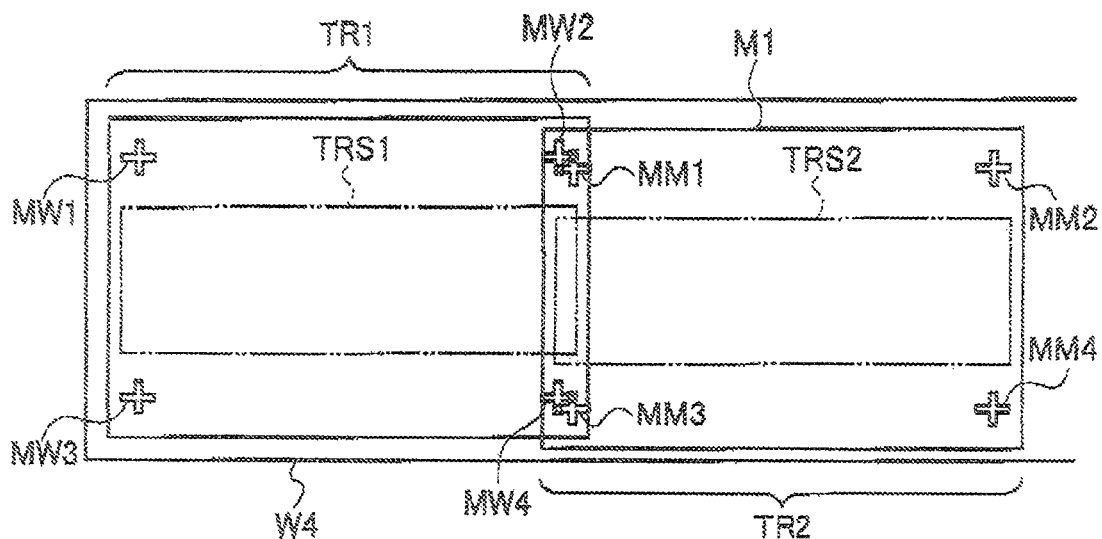
Z-AXIS DIRECTION
(b)
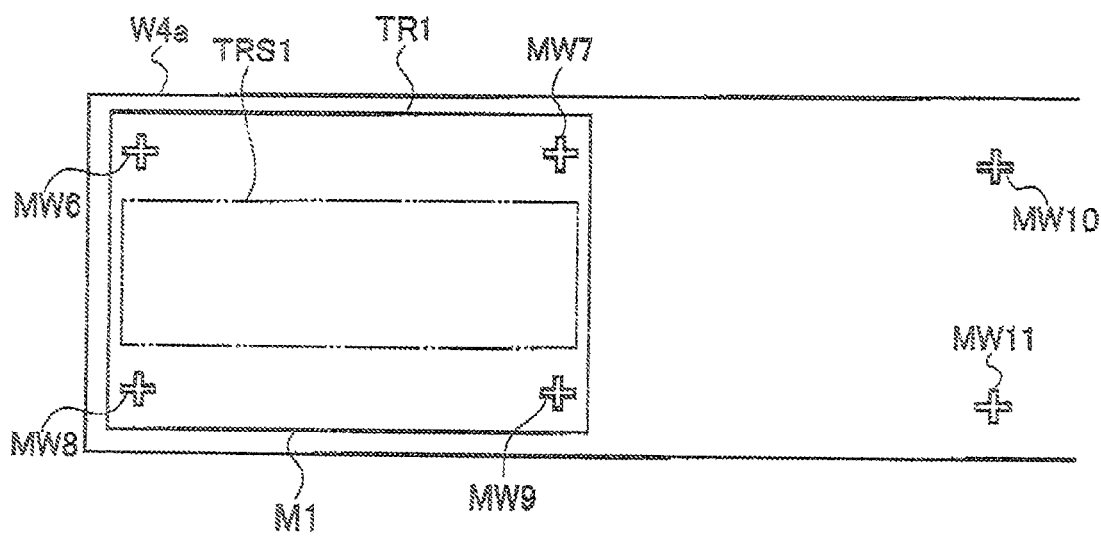

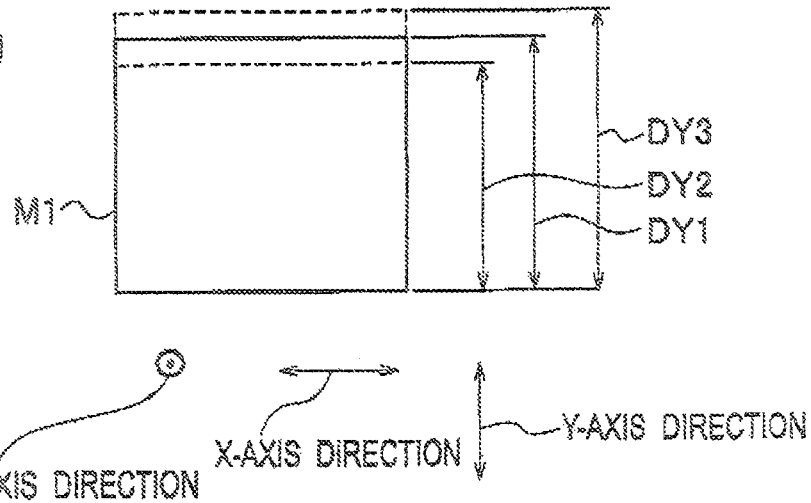
FIG. 10
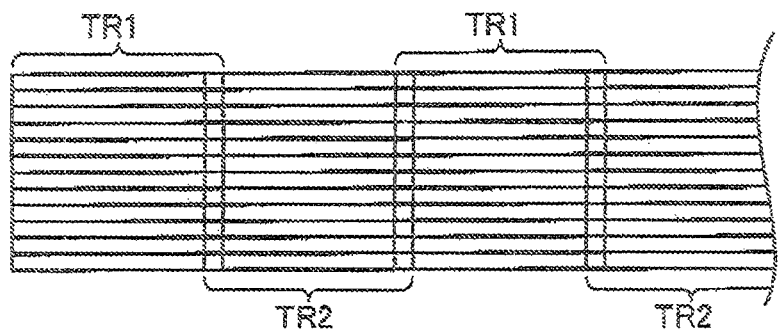
FIG. 11
(a)
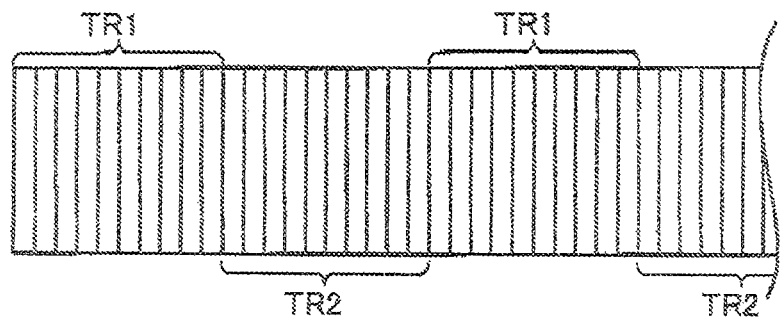
(b)

FIG. 19
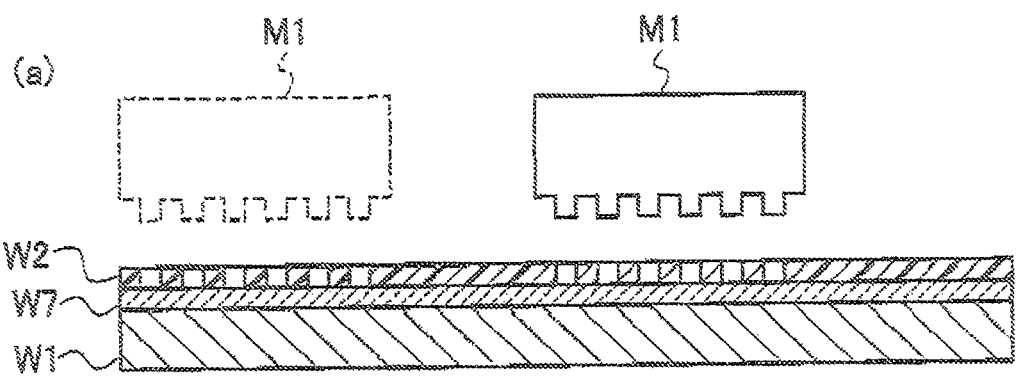
(a)
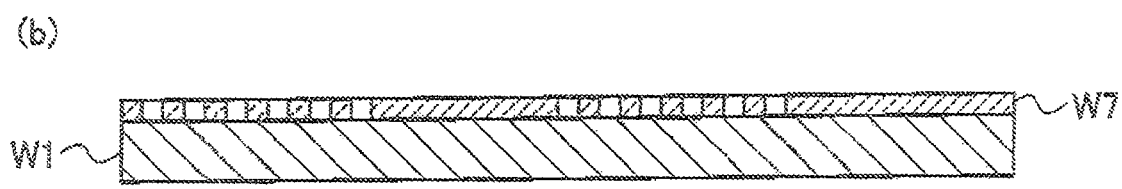
(b)
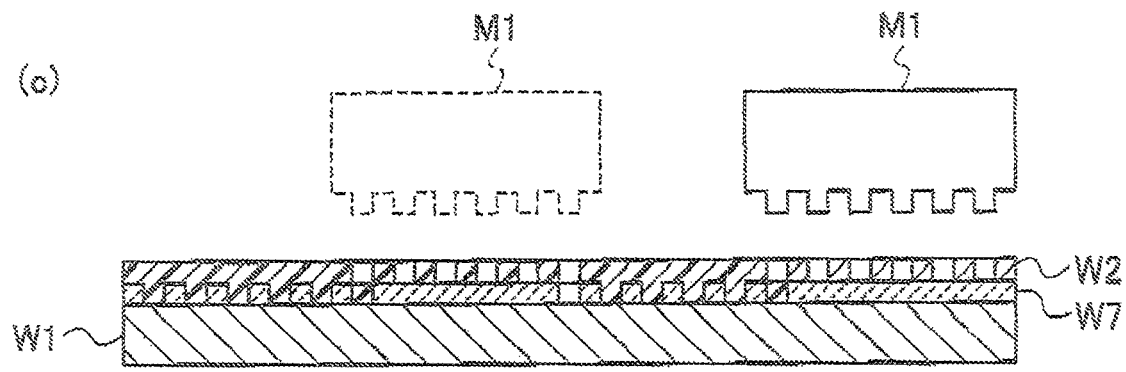
(c)

FIG. 20
(d)
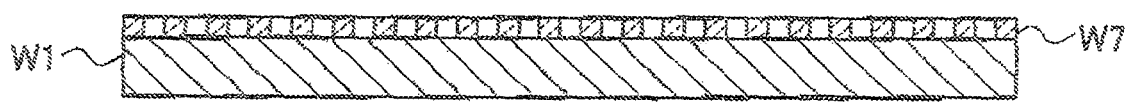
(e)
(f)

FIG. 21
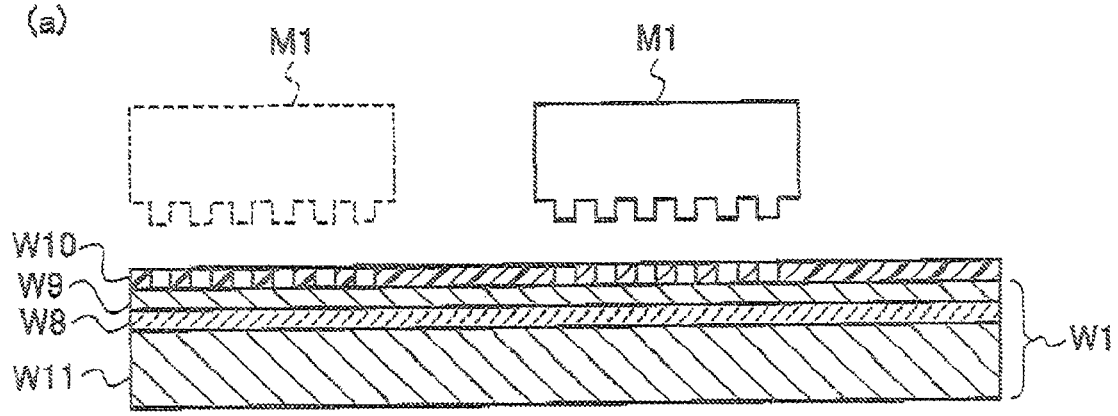
(a)
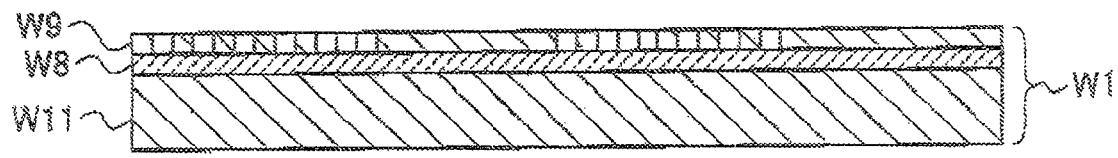
(b)
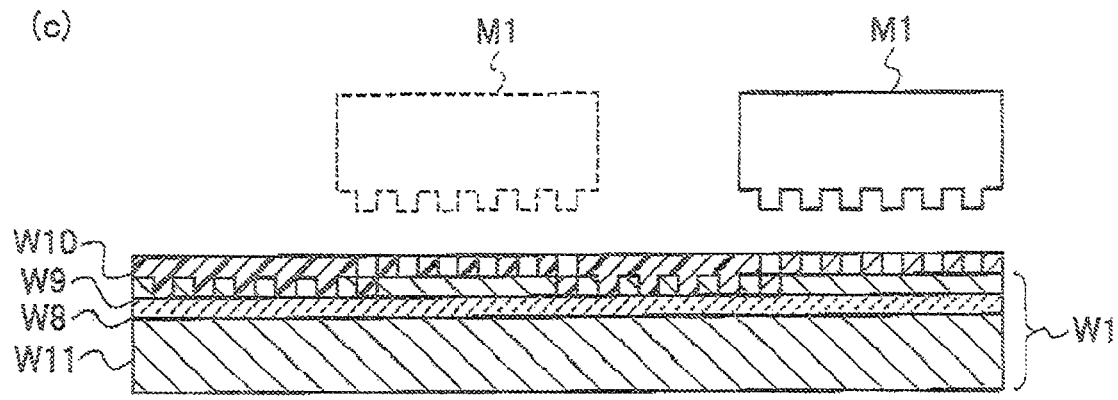
(c)
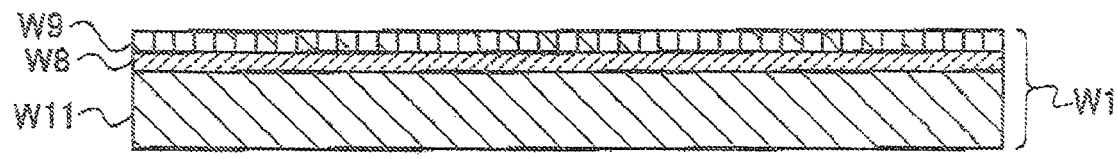
(d)

FIG. 23
(d)
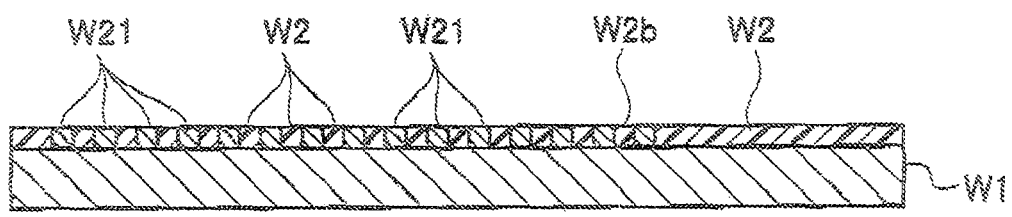
(e)
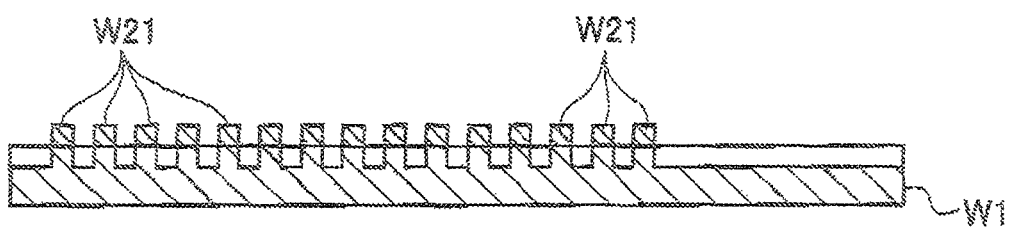
(f)

FIG. 24
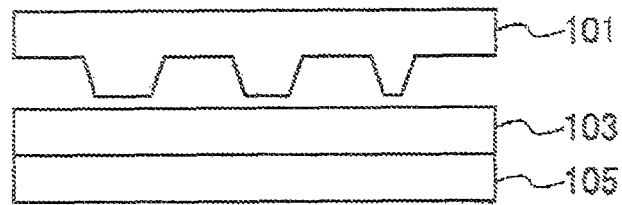
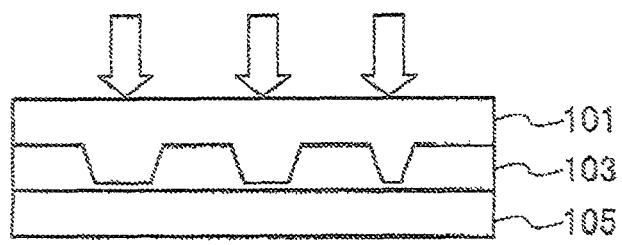
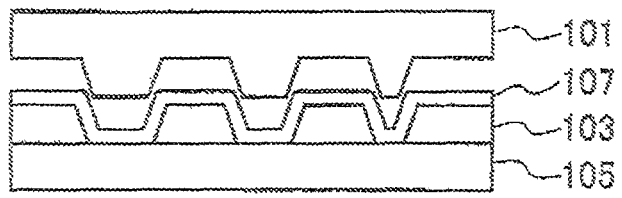
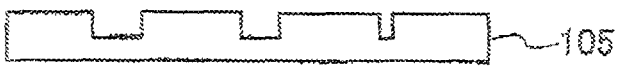

METHOD OF FORMING MICROPATTERN, DIE FORMED BY THIS METHOD OF FORMING MICROPATTERN, TRANSFER METHOD AND MICROPATTERN FORMING METHOD USING THIS DIE

This application is a divisional of U.S. application Ser. No. 12/530,134 filed Oct. 23, 2009, which claims priority to International Patent Application No. PCT/JP2008/054082 filed Mar. 6, 2008, now WO 2008/108441 A1, published on Sep. 9, 2008. The entirety of all of the above-listed applications are incorporated herein by reference.

TECHNICAL FIELD

The present invention relates to a micropattern forming method and the like, and more specifically relates to a method of continuously forming, on a substrate and the like, micropatterns similar to a transfer micropattern formed on a mold.

BACKGROUND ART

In recent years, there have been carried out research and development on a nanoimprint technique of preparing a mold (template or stamper) by forming a transfer ultra micropattern on a quartz substrate or the like by use of electron lithography or the like and pressing the mold with a predetermined pressure against a resist film (for example, a resist film made of a UV curable resin or a thermoplastic resin) formed on a substrate surface to be subjected to the transfer (a surface of a substrate) as an to-be-molded object, thereby transferring the transfer pattern formed on the mold. Such a technique is disclosed in the following document: Precision Engineering Journal of the International Societies for Precision Engineering and Nanotechnology 25 (2001) 192-199 (Document 1).

With reference to FIG. 24 (showing a conventional transfer method), a conventional technique will be described in detail by giving examples.

In the conventional transfer, a transfer micropattern formed on a die (mold) 101 made of, for example, quartz glass is pressed onto a substrate 105 coated with a UV curable resin (resist layer) 103, for example, and the resin 103 is cured by UV light irradiation (see FIGS. 24 (a) and 24 (b)). Thereafter, the die is released and a remaining film 107 is removed (see FIGS. 24 (c) and 24 (d)) and etching is performed (see FIG. 24 (d)). Thus, a micropattern shape on the die 101, which is copied onto the resin 103, is transferred onto the substrate 105 (see FIG. 24 (e)).

Incidentally, in the case of forming a transfer ultra micropattern on a die such as a quartz substrate by use of electron lithography or the like, when a portion where a transfer micropattern is to be formed has a large area, die preparation (formation of a micropattern on the die) takes a lone time. An apparatus for executing the electron lithography or the like has a high man-hour cost (a cost per unit time for using the apparatus), which increases the price of the die.

Moreover, a material cost for a material such as quartz glass used as the material of the die is also high. Thus, when the portion where the transfer micropattern is formed his a large area, the die itself is increased in size, which increases the price of the die.

In this regard, the following method has been heretofore known. Specifically, when the micropattern formed on the substrate 105 has a form in which the same pattern is repeated, for example, a transfer micropattern is formed on a surface of a relatively small die. Thereafter, the transfer micropatterns are continuously transferred onto the resist layer 103 provided on the substrate 105. Thus, a continuous micropattern is formed on a large area of the substrate 105 in the same manner as the case shown in FIG. 24. The above method for forming the continuous micropattern is disclosed in Japanese Patent Application Publication No. 2006-191089 (Document 2), for example.

Incidentally, in the case of forming the continuous micropattern on a large area of the substrate by connecting the transfer micropatterns as described above, the resist layer swells up due to a first transfer, for example. Thus, there is a possibility that a second transfer continuous with the first transfer is not accurately executed.

The above situation will be described in detail by using FIG. 25 (showing a conventional transfer state). By performing a first transfer using a die M20 (101), a micropattern P11 is formed on a resist layer W21 (103). In this event, together with the micropattern P11, a swelling part W22 and the like of the resist layer W21 are formed around the micropattern F11.

In the case of attempting to form a micropattern to be connected to the micropattern P11 in a portion P12 of the resist layer W21 by a second transfer using the die M20, a shape of an end of the micropattern P11 or a shape of an end (end on the micropattern P11 side) of the micropattern formed in the portion. P12, in other words, shapes of the micropatterns at a connection between the micropattern P11 and the micropattern formed in the portion P12 is deformed by the swelling part W22. Thus, there is a possibility that an accurate micropattern cannot be formed on the resist layer W21.

For example, in the state shown in FIG. 25, when the die M20 is lowered to form a micropattern in the portion P12 of the resist layer W21, the resist layer in the swelling part W22 existing below the die M20 has nowhere to go and thus may enter into a minute concave portion existing at the end (end on the portion P12 side) of the micropattern P11.

When an accurate micropattern cannot be formed on the resist layer W21, there is a problem that a form of a micropattern to be formed on a substrate W20 (a micropattern corresponding to the micropattern formed on the substrate 105 in FIG. 24 (e); a micropattern formed by etching) also becomes inaccurate.

The present invention was made in consideration of the above problems. It is an object of the present invention to provide a micropattern forming method for continuously forming micropatterns on a substrate, the micropatterns each corresponding to a transfer micropattern formed on a mold, the method being capable of forming micropatterns having an accurate form on the substrate.

DISCLOSURE OF THE INVENTION

A first aspect of the present invention is a micropattern forming method for continuously forming micropatterns on a substrate, the micropatterns each corresponding to a transfer micropattern formed on a mold, the micropattern forming method including: a first covering step of covering a surface of the substrate with a film of a transfer material; a first transfer step of transferring the transfer micropattern onto the transfer material formed in the first covering step by pressing the mold against the substrate having the film of the transfer material provided on its surface by the first covering step; a first micropattern forming step of forming a micropattern on the substrate by etching after the transfer of the micropattern by the first transfer step, the micropattern corresponding to the transfer micropattern on the mold; a first removal step of removing the transfer material provided in the first covering step after the formation of the micropattern by the first micropattern forming step; a second covering step of covering surface portions of the substrate with a film of the transfer material after the removal of the transfer material in the first removal step; a second transfer step of transferring the transfer micropattern onto the transfer material formed in the second covering step by pressing a mold against the substrate having the film of the transfer material provided on its surface by the second covering step; a second micropattern forming step of forming a micropattern on the substrate by etching after the transfer of the micropattern by the second transfer step, the micropattern corresponding to the transfer micropattern on the mold; and a second removal step of removing the transfer material provided in the second covering step after the formation of the micropattern by the second micropattern forming step.

A second aspect of the present invention is a micropattern forming method for continuously forming micropatterns on a substrate, the micropatterns each corresponding to a transfer micropattern formed on a mold, the micropattern forming method including: a first covering step of covering a surface of a lower transfer material in a substrate with a film of an upper transfer material, the substrate having its surface covered with a film of the lower transfer material; a first transfer step of transferring the transfer micropattern onto the upper transfer material formed in the first covering step by pressing the mold against the substrate having the film of the upper transfer material provided on its surface by the first covering step; a first micropattern forming step of forming a micropattern on the lower transfer material by etching after the transfer of the micropattern by the first transfer step, the micropattern corresponding to the transfer micropattern on the mold; a first removal step of removing the upper transfer material provided in the first covering step after the formation of the micropattern by the first micropattern forming step; a second covering step of covering the surface of the lower transfer material with a film of the upper transfer material after the removal of the upper transfer material in the first removal step; a second transfer step of transferring the transfer micropattern onto the upper transfer material formed in the second covering step by pressing a mold against the substrate having the film of the upper transfer material provided on its surface by the second covering step; a second micropattern forming step of forming a micropattern on the lower transfer material by etching after the transfer of the micropattern by the second transfer step, the micropattern corresponding to the transfer micropattern on the mold; a second removal step of removing the upper transfer material provided in the second covering step after the formation of the micropattern by the second micropattern forming step; a third micropattern forming step of forming the micropattern on the substrate by etching after the removal of the upper transfer material in the second removal step, the micropattern corresponding to the micropattern on the lower transfer material; and a third removal step of removing the lower transfer material after the formation of the micropattern by the third micropattern forming step.

A third aspect of the present invention is a micropattern forming method for continuously forming micropatterns on a substrate, the micropatterns each corresponding to a transfer micropattern formed on a mold, the micropattern forming method including: a first covering step of covering a surface of a third material in the substrate with a film of a transfer material, the substrate being formed by stacking a first material, a film-like second material and a film-like third material; a first transfer step of transferring the transfer micropattern onto the transfer material formed in the first covering step by pressing the mold against the substrate having the film of the transfer material provided on its surface by the first covering step; a first micropattern forming step of forming a micropattern on the third material by etching after the transfer of the micropattern by the first transfer step, the micropattern corresponding to the transfer micropattern on the mold; a first removal step of removing the transfer material provided in the first covering step after the formation of the micropattern by the first micropattern forming step; a second covering step of covering the surface of the third material with a film of the transfer material after the removal of the transfer material in the first removal step; a second transfer step of transferring the transfer micropattern onto the transfer material formed in the second covering step by pressing a mold against the substrate having the film of the transfer material provided on its surface by the second covering step; a second micropattern forming step of forming a micropattern on the third material by etching after the transfer of the micropattern by the second transfer step, the micropattern corresponding to the transfer micropattern on the mold; and a second removal step of removing the transfer material provided in the second covering step after the formation of the micropattern by the second micropattern forming step.

A fourth aspect of the present invention is a micropattern forming method for continuously forming micropatterns on a substrate, the micropatterns each corresponding to a transfer micropattern formed on a mold, the micropattern forming method including: a first covering step of covering a surface of the substrate with a film of a transfer material; a first transfer step of transferring the transfer micropattern onto the transfer material formed in the first covering step by pressing the mold against the substrate having the film of the transfer material provided on its surface by the first covering step; a first provision step of providing a covering member in a portion where the substrate is exposed by the transfer of the transfer micropattern in the first transfer step; a first removal step of removing the transfer material provided in the first covering step after covering the portion where the substrate is exposed with the covering member in the first provision step; a second covering step of covering surface portions of the substrate with a film of the transfer material after the removal of the transfer material in the first removal step; a second transfer step of transferring the transfer micropattern onto the transfer material formed in the second covering step by pressing a mold against the substrate having the film of the transfer material provided on its surface by the second covering step; a second provision step of covering a portion where the substrate is exposed by the transfer of the transfer micropattern in the second transfer step with a covering member; a second removal step of removing the transfer material provided in the second covering step after covering the portion where the substrate is exposed with the covering member in the second provision step; a micropattern forming step of forming a micropattern on the substrate by etching after the removal of the transfer material by the second removal step, the micropattern corresponding to the transfer micropattern on the mold; and a third removal step of removing the covering members provided in the first and second provision steps after the formation of the micropattern by the micropattern forming step.

A fifth aspect of the present invention is the micropattern forming method according to any one of the first to fourth aspects, further including: a positional relationship detecting step of detecting a positional relationship between the micropattern formed in the first micropattern forming step and the transfer micropattern formed on the mold after the micropattern is formed in the first micropattern forming step and before the transfer is performed in the second transfer step; and a correction step of correcting a position of the mold relative to the substrate on the basis of a result of the detection in the positional relationship detecting step, so that the transfer micropattern to be formed in the second micropattern forming step is accurately connected to the micropattern formed in the first micropattern forming step.

A sixth aspect of the present invention is the micropattern forming method according to the fifth aspect, in which the correction step is a step of performing the correction by compensating a change in shape of the mold to an accurate shape by using an actuator.

A seventh aspect of the present invention is the micropattern forming method according to the fifth aspect, in which, by the first transfer step and the first micropattern forming step, micropatterns are formed in a first portion of the transfer material and in a second portion away from the first portion by a predetermined distance; by the second transfer step and the second micropattern forming step, a micropattern is formed in a third portion connecting the first and second portions; and the positional relationship detecting step is a step of detecting a positional relationship between the micropattern formed in the first micropattern forming step and the transfer micropattern formed on the mold by detecting a relative positional deviation amount of the transfer micropattern on the mold at a boundary between the first portion and the transfer micropattern formed on the mold and by detecting a relative positional deviation amount of the transfer micropattern on the mold at a boundary between the second portion and the transfer micropattern formed on the mold.

A eighth aspect of the present invention is the micropattern forming method according to the seventh aspect of the present invention, in which a portion of the mold having the transfer micropattern formed therein is formed to have a rectangular planar shape; by arranging the first portion, the third portion and the second portion in a straight line, a micropattern is formed within a rectangular area; the positional relationship detecting step is a step of detecting, on one side in a width direction of the rectangular micropattern, a positional deviation amount of the transfer micropattern on the mold relative to the first portion at the boundary between the first portion and the transfer micropattern formed on the mold and a positional deviation amount of the transfer micropattern on the mold relative to the second portion at the boundary between the second portion and the transfer micropattern formed on the mold, and of detecting, on the other side in the width direction of the rectangular micropattern, a positional deviation amount of the transfer micropattern on the mold relative to the first portion at the boundary between the first portion and the transfer micropattern formed on the mold; and the correction step is a step of performing the correction by compensating the dimension of the mold in the width direction by changing an elastic deformation amount of the mold in the width direction of the rectangular micropattern by using an actuator on the basis of the positional deviation amount on the other side in the width direction.

A ninth aspect of the present invention is a die manufactured by electroforming using a substrate including a micropattern formed by using the micropattern forming method according to any one of the first to fourth aspects.

A tenth aspect of the present invention is a mold formed by use of a substrate including a micropattern formed by using the micropattern forming method according to any one of the first to fourth aspects, in which a portion of the mold having the micropattern formed therein is formed to be long by performing the transfer steps and the micropattern forming steps in alignment with each other.

An eleventh aspect of the present invention is a transfer method of transferring the micropattern on the die according to the tenth aspect onto an to-be-molded object, in which the portion of the die having the micropattern formed therein is formed into a convex surface shape formed by using a part of a lateral surface of a cylinder in such a manner that a longitudinal direction of the portion is set as a circumferential direction of the cylinder, or the portion of the die having the micropattern formed therein is formed into a convex surface shape formed by using a part of a lateral surface of an elliptic cylinder in such a manner that the longitudinal direction of the portion is set as a circumferential direction of the elliptic cylinder, and the transfer is performed while moving a linear pressing portion of the convex surface against the to-be-molded object from one end to the other end of the convex surface.

A twelfth aspect of the present invention is the transfer method according to the eleventh aspect, in which, after the first transfer is performed, the die is moved in a width direction of the micropattern on the die relative to the to-be-molded object, and, by performing a second transfer in the transfer method according to the ninth aspect, the micropattern on the die is transferred onto the to-be-molded object in a manner connected in the width direction.

A thirteenth aspect of the present invention is a micropattern forming method for continuously forming a micropatterns on the to-be-molded object, each micropattern corresponding to the micropattern formed on the die according to the tenth aspect, the method including: a first (third) covering step of covering a surface of the to-be-molded object with a film of a transfer material; a first (fourth) transfer step of transferring the transfer micropattern onto the transfer material formed in the first (third) covering step by pressing the die against the to-be-molded object having the film of the transfer material provided on its surface by the first (third) covering step; a first (third or fourth) micropattern forming step of forming a micropattern on the to-be-molded object by etching after the transfer of the micropattern by the first (fourth) transfer step, the micropattern corresponding to the transfer micropattern on the die; a first (third or fourth) removal step of removing the transfer material provided in the first (third) covering step after the formation of the micropattern by the first (third or fourth) micropattern forming step; a second (fourth) covering step of covering the surface of the to-be-molded object with a film of the transfer material after the removal of the transfer material in the first (third or fourth) removal step; a second (fifth) transfer step of transferring the transfer micropattern onto the transfer material formed in the second covering step by pressing the die against the to-be-molded object having the film of the transfer material provided on its surface by the second (fourth) covering step; a second (fourth or fifth) micropattern forming step of forming a micropattern on the to-be-molded object by etching after the transfer of the micropattern by the second (fifth) transfer step, the micropattern corresponding to the transfer micropattern on the die; and a second (fourth or fifth) removal step of removing the transfer material provided in the second covering step after the formation of the micropattern by the second (fourth or fifth) micropattern forming step.

A fourteenth aspect of the present invention is the micropattern forming method according to the thirteenth aspect, in which, in each transfer step, the portion of the die having the micropattern formed therein is formed into a convex surface shape formed by using a part of a lateral surface of a cylinder in such a manner that a longitudinal direction of the portion is set as a circumferential direction of the cylinder, or the portion of the die having the micropattern formed therein is formed into a convex surface shape formed by using a part of a lateral surface of an elliptic cylinder in such a manner that the longitudinal direction of the portion is set as a circumferential direction of the elliptic cylinder, and the transfer is performed while moving a linear pressing portion of the convex surface against the to-be-molded object from one end to the other end of the convex surface.

A fifteenth aspect of the present invention is the micropattern forming method according to any one of the first to fourth aspects, in which micropatterns are formed in portions of the substrate corresponding to portions of one color of a checkered pattern in the first transfer step and the first micropattern forming step, and micropatterns are formed in portions of the substrate corresponding to portions of the other color of the checkered pattern in the second transfer step and the second micropattern forming step.

A sixteenth aspect of the present invention is a micropattern forming method for continuously forming micropatterns on a substrate, the micropatterns each corresponding to a transfer micropattern formed on a mold, the micropattern forming method including: a covering step of covering a surface of the substrate with a film of a transfer material; a transfer step of transferring the transfer micropatterns at predetermined intervals in a plurality of spots on the transfer material formed in the covering step by pressing the mold more than once against the substrate having the film of the transfer material provided on its surface by the covering step; a micropattern forming step of forming the micropattern at predetermined intervals in a plurality of spots on the substrate by etching after the transfer of the micropatterns by the transfer step, the micropatterns each corresponding to the transfer micropattern on the mold; and a removal step of removing the transfer material provided in the covering step after the formation of the micropatterns by the micropattern forming step, in which, the micropatterns each corresponding to the transfer micropattern formed on the mold are continuously formed on the substrate by repeating a cycle of the covering step, the transfer step, the micropattern forming step and the removal step in this order for multiple times.

A seventeenth aspect of the present invention is a micropattern forming method for continuously forming micropatterns on a substrate, the micropatterns each corresponding to a transfer micropattern formed on a mold, the micropattern forming method including: a covering step of covering a surface of a lower transfer material in the substrate with a film of an upper transfer material, the substrate having its surface covered with a film of the lower transfer material; a transfer step of transferring the transfer micropatterns at predetermined intervals in a plurality of spots on the upper transfer material formed in the covering step by pressing the mold more than once against the substrate having the film of the upper transfer material provided on its surface by the covering step; a micropattern forming step of forming the micropatterns at predetermined intervals in a plurality of spots on the lower transfer material by etching after the transfer of the micropatterns by the transfer step, the micropatterns each corresponding to the transfer micropattern on the mold; and a removal step of removing the transfer material provided in the covering step after the formation of the micropatterns by the micropattern forming step, in which, the micropatterns each corresponding to the transfer micropattern formed on the mold are continuously formed on the lower transfer material by repeating a cycle of the covering step, the transfer step, the micropattern forming step and the removal step in this order for multiple times, a micropattern corresponding to the micropatterns on the lower transfer material is formed on the substrate by etching after the formation of the micropatterns on the lower transfer material, and micropatterns each corresponding to the transfer micropattern formed on the mold are continuously formed on the substrate by removing the lower transfer material after the formation of the micropattern on the substrate.

An eighteenth aspect of the present invention is a micropattern forming method for continuously forming micropatterns on a substrate, the micropatterns each corresponding to a transfer micropattern formed on a mold, the micropattern forming method including: a covering step of covering a surface of a third material in the substrate with a film of a transfer material, the substrate being formed by stacking a first material, a film-like second material and a film-like third material; a transfer step of transferring the transfer micropatterns at predetermined intervals in a plurality of spots on the transfer material formed in the covering step by pressing the mold more than once against the substrate having the film of the transfer material provided on its surface by the covering step; a micropattern forming step of forming the micropatterns at predetermined intervals in a plurality of spots on the third material by etching after the transfer of the micropatterns by the transfer step, the micropatterns each corresponding to the transfer micropattern on the mold; and a removal step of removing the transfer material provided in the covering step after the formation of the micropatterns by the micropattern forming step, in which the micropatterns each corresponding to the transfer micropattern formed on the mold are continuously formed on the substrate by repeating a cycle of the covering step, the transfer step, the micropattern forming step and the removal step in this order for multiple times.

A nineteenth aspect of the present invention is a micropattern forming method for continuously forming micropatterns on a substrate, the micropatterns each corresponding to a transfer micropattern formed on a mold, the micropattern forming method including: a covering step of covering a surface of the substrate with a film of a transfer material; a transfer step of transferring the transfer micropatterns at predetermined intervals in a plurality of spots on the transfer material formed in the covering step by pressing the mold more than once against the substrate having the film of the transfer material provided on its surface by the covering step; a provision step of providing a covering member in a portion where the substrate is exposed by the transfer of the transfer micropattern in the transfer step; and a removal step of removing the transfer material provided in the covering step after covering the portion where the substrate is exposed with the covering member in the provision step, in which, the micropattern corresponding to the transfer micropattern on the mold is formed on the substrate by etching after repeating the respective steps for multiple cycles in the order of the covering step, the transfer step, the provision step and the removal step, and the micropatterns corresponding to the transfer micropattern formed on the mold are continuously formed on the substrate by removing the covering members provided in the provision step after the formation of the micropattern.

According to the first to nineteenth aspects of the present invention, there is achieved an effect that micropatterns having an accurate form can be formed on the substrate in the micropattern forming method for continuously forming micropatterns on the substrate, the micropatterns each corresponding to the transfer micropattern formed on the mold.

BRIEF DESCRIPTION OF THE DRAWINGS

FIGS. 4 (a) and 4 (b) are views showing a substrate having a micropattern formed thereon.

FIGS. 5 (a) and 5 (b) are views showing a substrate having a micropattern formed thereon.

FIGS. 7 (a) and 7 (b) are views showing a state of forming connected micropatterns on the substrate.

FIGS. 8 (a) and 8 (b) are views showing examples of results of detection by the positional relationship detecting device.

FIGS. 9 (a) and 9 (b) are views showing modified examples of positional deviation detection by the positional relationship detecting device.

FIG. 10 is a view showing a state of the mold deformed by using an actuator.

FIGS. 11 (a) and 11 (b) are views showing a state of forming connected micropatterns on the substrate.

FIGS. 19 (a) to 19 (c) are views schematically showing steps of a micropattern forming method according to a second embodiment of the present invention.

FIGS. 20 (d) to 20 (f) are views schematically showing steps of the micropattern forming method according to the second embodiment of the present invention.

FIGS. 21 (a) to 21 (d) are views schematically showing steps of a micropattern forming method according to a third embodiment of the present invention.

FIGS. 23 (d) to 23 (f) are views schematically showing steps of the micropattern forming method according to the fourth embodiment of the present invention.

FIGS. 24 (a) to 24 (e) are views showing a conventional transfer method.

BEST MODE FOR CARRYING OUT THE INVENTION

With reference to the drawings, embodiments of the present invention will be described below.

First Embodiment

Figure 3:
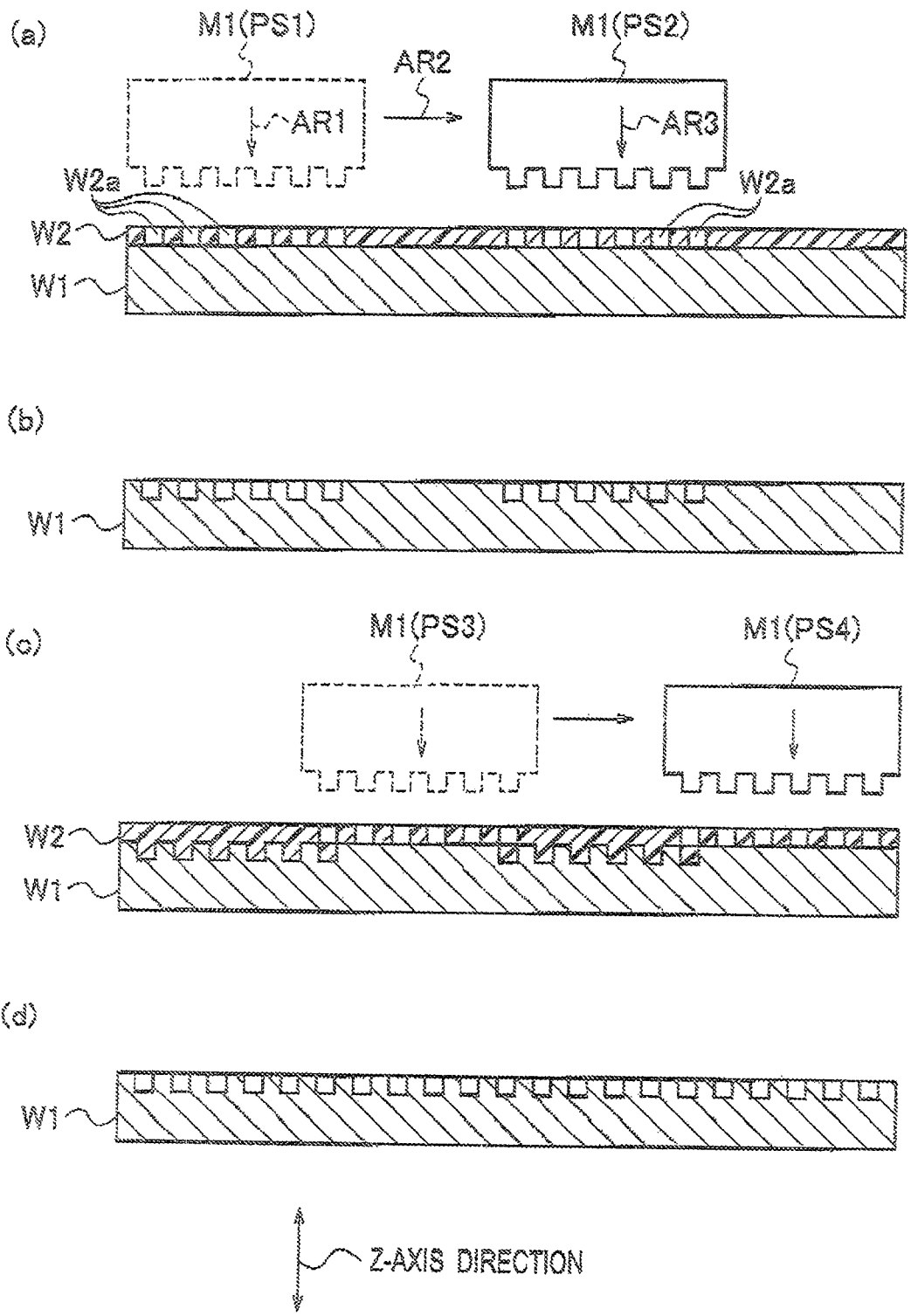
FIGS. 3 (a) to 3 (d) are views schematically showing steps of a micropattern forming method according to a first embodiment of the present invention.

FIG. 3 is a view schematically showing steps of a micropattern forming method according to a first embodiment of the present invention.

The micropattern forming method is for continuously forming, on a planar surface of a substrate W1, micropatterns (the same micropattern as a mold (template or stamper) M1) each corresponding to a transfer micropattern (numerous minute convexes and concaves) formed on the mold M1 by transferring the pattern in a divided manner. An area (for example, an area of the planar surface) of the substrate W1 on which the micropattern is to be formed is larger than that of a surface of the mold M1 on which the transfer micropattern is formed. Note that the mold M1 is made of for example, quartz glass, and the transfer micropattern is formed on a planar surface of the mold M1.

In the micropattern forming method, first, a transfer material (for example, an ultraviolet curable resin before curing, more specifically, "PAK-01" made by Toyo Gosei Kogyo Co., Ltd.) is spin-coated onto the surface (for example, approximately the entire planar surface on one side in a thickness direction of the substrate W1) of the substrate (made of, for example, silicon, more specifically, single crystal silicon) W1. Thereby, the surface of the substrate W1 is covered with a thin film of transfer material W2. In this event, the substrate W1 is preferably surface-treated to allow the surface thereof and the thin film to more firmly adhere to each other.

Next, the planar surface of the mold M1 having the transfer micropattern formed thereon is pressed against a part of the substrate. W1 having the thin film of the transfer material W2 provided on its surface. Accordingly, the transfer micropattern on the mold M1 is transferred onto the thin film of transfer material W2 (see FIG. 3 (a)). In this transfer, the transfer material W2 is cured by irradiating the transfer material W2 with ultraviolet light.

Note that the transfer shown in FIG. 3 (a) is performed, for example, more than once, but may also be performed only once. In FIG. 3 (a), when the mold M1 is positioned at PS1, the mold M1 is lowered as indicated by an arrow AR1 to perform the first transfer. Thereafter, the mold M1 is moved as indicated by an arrow AR2 and, when the mold M1 is positioned at PS2, the mold M1 is lowered as indicated by an arrow AR3 to perform the second transfer.

Moreover, in the transfer shown in FIG. 3 (a), the ultraviolet irradiation performed in the first transfer (transfer at PS1) allows the transfer material W2 to be cured only at a portion of the transfer material W2 where a micropattern is formed in the first transfer and a portion adjacent thereto. In other words, even if the ultraviolet irradiation is performed in the first transfer, a portion of the transfer material W2 where the second transfer (transfer at PS2) is to be performed is not cured.

Moreover, the first transfer (transfer at PS1) and the second transfer (transfer at PS2) are performed at a predetermined interval. For example, by performing transfer in a subsequent step as shown in FIG. 3 (c) at a position between the first transfer (transfer at PS1) and the second transfer (transfer at PS2), a continuously connected micropatterns are formed on the substrate W1.

Furthermore, after the transfer shown in FIG. 3 (a) is performed, very thin transfer material films (not shown) are formed in minute concave portions W2a of the transfer material W2, which are formed by minute convex portions of the transfer micropattern on the mold M1. In other words, at bottoms of the minute concave portions W2a of the transfer material W2, the substrate W1 is covered with very thin films of the transfer material W2.

After the transfer shown in FIG. 3 (a) is performed and the micropattern of the transfer material W2 is formed, the mold M1 is moved away from the substrate W1 and the transfer material W2. Subsequently, a remaining film is removed in the same manner as the case shown in FIGS. 24 (c) and 24 (d). Specifically, the very thin film of the transfer material W2 covering the substrate W1 at the minute concave portions W2a of the transfer material W2 is removed by O2 asking and the like. Thus, the surface of the substrate W1 is exposed as shown in FIG. 3 (a) with the same micropattern as the transfer micropattern on the mold M1.

After removal of the remaining film, by etching (for example, dry etching) the substrate W1 while using the transfer material W2 as a mask material, a micropattern corresponding to the transfer micropattern on the mold M1 is formed on the substrate W1. Specifically, a micropattern corresponding to the micropattern of the transfer material W2 as shown in FIG. 3 (a) is formed on the substrate W1.

Note that the transfer material W2 remains intact even after the etching. Moreover, as the dry etching, reactive ion etching (RIE), high-aspect ratio dry etching (Bosch process or DeepRIE) or the like is preferably adopted.

After the micropattern is formed on the substrate W1, the transfer material W2 shown in FIG. 3 (a) is removed (cleaned) by a solvent which dissolves only the transfer material W2 without dissolving the substrate W1 (see FIG. 3 (b)).

After the transfer material W2 is removed, the surface portions of the substrate W1 where the micropatterns are formed and other surface portions (portions where no micropatterns are formed) of the substrate W1, the other surface portions being connected to the above portions, are covered with a thin film of the transfer material W2. For example, approximately the entire planar surface on one side in the thickness direction of the substrate W1 is covered with the transfer material W2 in the same manner as the case shown in FIG. 3 (a).

Subsequently, in approximately the same manner as the case shown in FIG. 3 (a), the mold M1 is pressed against another portion continuously connected to the portion where the micropattern is formed as shown in FIG. 3 (b), the portion pressed against the Mold M1 being a part of the substrate W1 having the thin film of transfer material W2 provided on its surface. Thereafter, ultraviolet irradiation is performed to transfer the transfer micropattern onto the transfer material W2 (see FIG. 3 (c)).

Note that the mold used in the transfer shown in FIG. 3 (c) and the mold used in the transfer shown in FIG. 3 (a) are the same. However, the mold used in the transfer shown in FIG. 3 (c) and the mold used in the transfer shown in FIG. 3 (a) may be different from each other.

After the micropattern is transferred onto the transfer material W2 as shown in FIG. 3 (c), the mold M1 is moved away from the substrate W1 and the transfer material W2, the remaining film is removed and then the same etching as that described above is performed for the substrate W1. Thus, a micropattern which corresponds to the transfer micropattern on the mold M1, and which is continuously connected to the micropatterns shown in FIG. 3 (b) (similar to a micropattern obtained by continuously connecting the transfer micropatterns on the mold M1) is formed on the substrate W1.

After the continuously connected micropatterns are formed on the substrate W1, the transfer material W2 provided in the step shown in FIG. 3 (c) is removed by the solvent which dissolves only the transfer material W2 without dissolving the substrate W1 (see FIG. 3 (d)).

The substrate W1 having the micropattern thus formed thereon is used for manufacturing an electroformed mold, a film replica and the like. Specifically, a nickel mold is manufactured by a nickel electroforming process based on the substrate W1 having the micropattern formed thereon. Alternatively, a micropattern is transferred onto a resin by using the substrate W1 having the micropattern formed thereon to manufacture a resin replica such as a plastic resin and an ultraviolet curable resin. Thereafter, the nickel mold is manufactured from the resin replica by the nickel electroforming process. This nickel mold includes a micropattern (the same micropattern as that on the substrate W1) corresponding to the micropattern formed on the substrate W1.

By use of the nickel mold, transfer of the micropattern onto a resin substrate is performed once or more than once continuously. Thus, an optical element for a display, a wire-grid polarizer, a photonic crystal and art antireflection structure are generated.

Note that the continuously connected micropatterns as shown in FIG. 3 (d) is formed on the substrate W1 in such a manner that a part (an end portion in a horizontal direction in FIGS. 3 (a) and 3 (b)) of the micropattern formed on the transfer material W2 and the substrate W1 as shown in FIGS. 3 (a) and 3 (b) and a part (an end portion in a horizontal direction in FIGS. 3 (c) and 3 (d)) of the micropattern formed on the transfer material W2 and the substrate W1 as shown in FIGS. 3 (c) and 3 (d) overlap with each other (by, for example, about 100. mu.m to 500. mu.m). However, such an overlap is not always necessary. Specifically, the end portion of the micropattern formed on the transfer material W2 and the substrate W1 as shown in FIGS. 3 (a) and 3 (b) and the end portion of the micropattern formed on the transfer material W2 and the substrate W1 as shown in FIGS. 3 (c) and 3 (d) may be adjacent to each other or slightly away from each other without overlapping with each other.

The micropattern formed on the substrate W1 in the steps shown in FIG. 3 is extended in a direction (a width direction of the substrate W1) perpendicular to a longitudinal direction of the substrate W1 as shown in FIG. 4 (a). However, a substrate (similar to a substrate W3 shown in FIG. 5) W1a having a micropattern extended in the longitudinal direction of the substrate W1 as shown in FIG. 4 (b) may be manufactured, for example, by changing a mounting posture of the mold M1.

At a connection between the micropatterns (a connection between the micropattern formed in the steps of FIGS. 3 (a) and 3 (b) and the micropattern formed in the steps of FIGS. 3 (c) and 3 (d)) in the substrate W1a shown in FIG. 4 (b), small steps W3a are found as in the case of the substrate W3 shown in FIG. 5. However, the steps W3a cause no practical inconvenience.

Here, description will be given of a transfer apparatus 1 for executing the steps of FIGS. 3 (a) and 3 (c).

Figure 1:
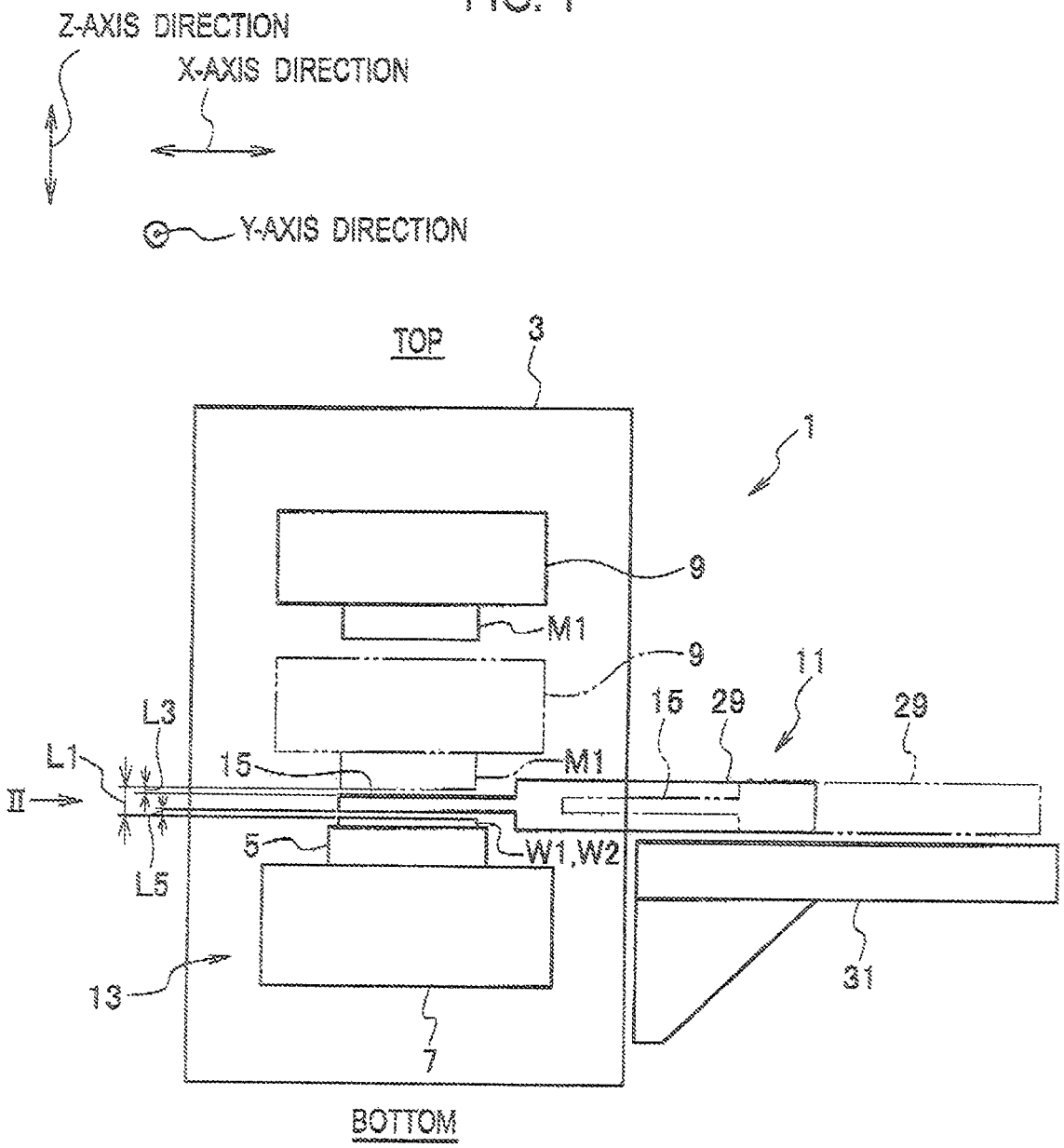
FIG. 1 is a front view showing a schematic configuration of a transfer apparatus.
Figure 2:
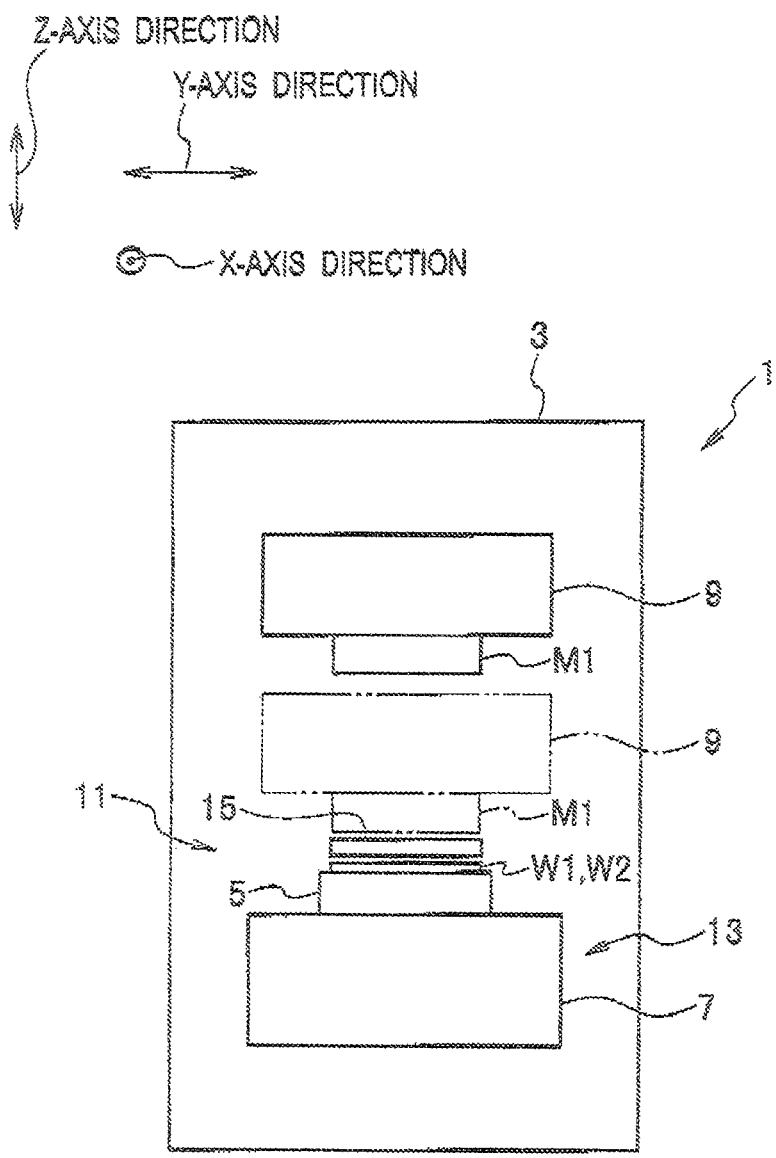
FIG. 2 is a side view showing the schematic configuration of the transfer apparatus and is a view seen from an arrow II in FIG. 1.

FIG. 1 is a front view showing a schematic configuration of the transfer apparatus 1. FIG. 2 is a side view showing the schematic configuration of the transfer apparatus 1 and is a view seen from an arrow 11 in FIG. 1.

Hereinafter, for convenience of explanation, it is assumed that one direction in a horizontal direction is an X-axis direction, another direction in the horizontal direction which is perpendicular to the X-axis direction is a Y-axis direction, and a direction (a top and bottom direction or a vertical direction) perpendicular to the X-axis direction and the Y-axis direction is a Z-axis direction.

The transfer apparatus 1 is an apparatus which transfers a transfer micropattern formed on a surface (for example, a planar lower surface) of a stamper (mold) M1 onto a surface (for example, a planar upper surface) of the transfer material W2 on the substrate W1 by allowing the surface of the stamper M1 to come into contact with the surface of the transfer material W2 and pressing the stamper M1 as needed.

The transfer apparatus 1 includes a base frame 3. A substrate carrier 5 for holding the substrate W1 is provided in the base frame 3. The substrate carrier 5 has, for example, a planar upper surface, on which the substrate W1 having thin transfer material W2 provided thereon can be mounted and held. As to the substrate W1 thus mounted and held, a thickness direction thereof is the Z-axis direction and the thin transfer material W2 is provided on the upper surface thereof. Moreover, the substrate W1 is located at a predetermined position in the X-axis and Y-axis directions.

The substrate carrier 5 is supported by the base frame 3 through an XY 8 stage 7. Therefore, the substrate carrier 5 (the substrate W1) is freely moved and positioned in the X-axis and Y-axis directions and is also freely rotated and positioned around an axis parallel to the Z axis by driving an actuator (not shown), such as a servo motor included in the XY stage 7, under the control of a control device (not shown).

In the base frame 3, a die carrier (mold carrier) 9 is provided. The die carrier 9 has, for example, a planar lower surface, on which the stamper M1 can be held. As to the stamper M1 thus held, the lower surface having a transfer micropattern formed thereon faces the substrate carrier 5 (the substrate W1 and the transfer material W2).

The die carrier 9 is supported by the base frame 3 through an unillustrated linear guide bearing and is freely moved and positioned in the Z-axis direction by driving an actuator (not shown) such as a servo motor under the control of the control device.

Moreover, in the transfer apparatus 1, a UV light generator (not shown) for irradiating the substrate W1 (the transfer material W2) with ultraviolet light is provided. Thus, in formation of a micropattern on the transfer material W2, the transfer material W2 made of the ultraviolet curable resin can be cured.

Note that, as the transfer material W2, a thermoplastic resin or a thermosetting resin may be adopted instead of the ultraviolet curable resin. In this case, a heating device (not shown) for heating the substrate W1 (the transfer material W2) is provided in the transfer apparatus 1. Moreover, as the substrate W1, a glass substrate may be adopted instead of the silicon substrate. Furthermore, as the material of the mold M1, silicon, metal such as nickel, glassy carbon or the like may be adopted instead of quartz glass.

Moreover, a positional relationship detecting device 11 and a correction device 13 are provided in the transfer apparatus 1.

The positional relationship detecting device 11 is an apparatus as follows. After the micropattern is formed on the substrate W1 by a first group of single or multiples transfer and etching as shown in FIGS. 3 ($a$) and 3 ($b$), and before a second group of single or multiple transfer is performed as shown in FIG. 3 ($c$)), the positional relationship detecting device 11 detects a positional relationship between a micropattern formed on the substrate W1 by the first group of multiple transfer (pressing of the transfer material W2 by the mold MD and a transfer micropattern formed on the mold (the mold which is at a position for performing the second group of transfer in the X-axis and Y-axis directions and is away from the substrate W1 and the transfer material W2 in the Z-axis direction, for example, the mold positioned at PS3 or PS4 in FIG. 3 ($c$)) M1.

The correction device 13 is an apparatus which corrects a position of the mold M1 relative to the substrate W1, based on a result of detection by the positional relationship detecting device 11, so as to accurately connect the transfer micropattern to be formed by the second group of transfer and etching to the micropattern formed on the substrate W1 by the first group of transfer and etching. Note that this correction is performed, for example, when the mold M1 is positioned at PS3 and PS4 in the state shown in FIG. 3 ($c$).

The positional relationship detecting device 11, the correction device 13 and the like will be described in more detail by giving examples.

Figure 6:
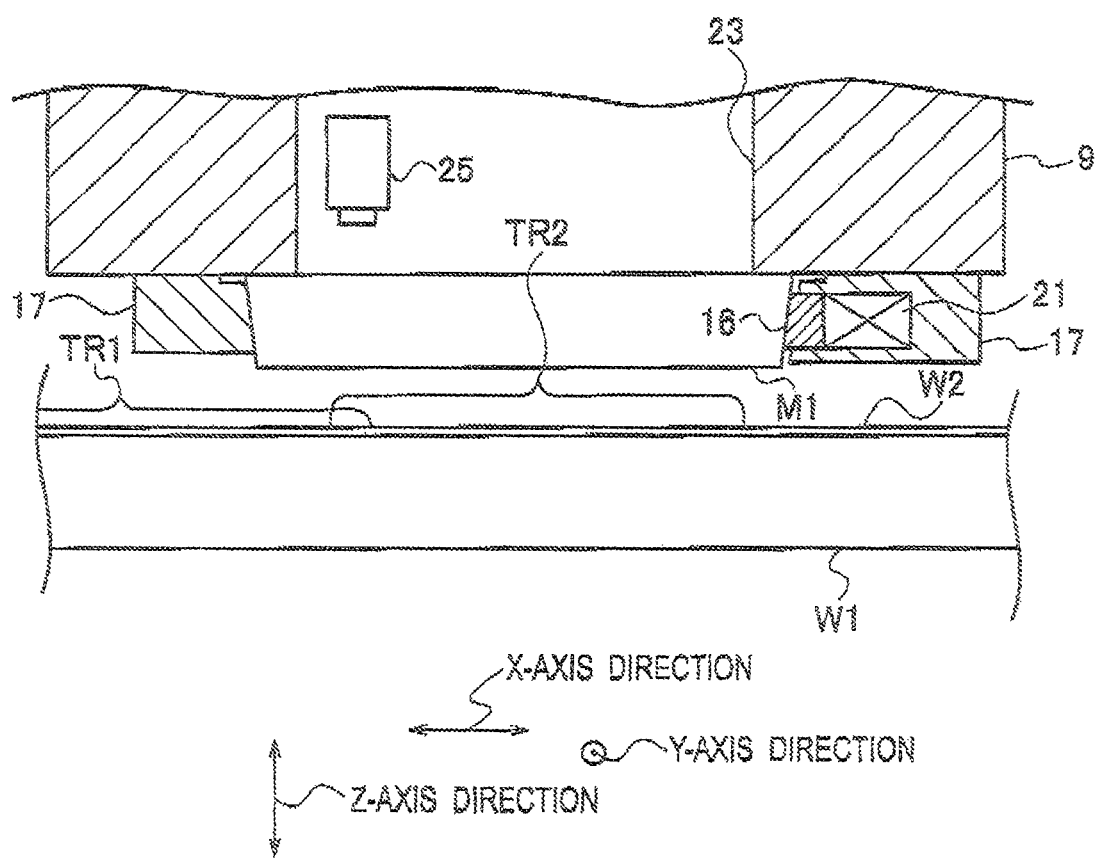
FIG. 6 is a view showing an installation mode of a mold to a mold carrier and a camera included in a positional relationship detecting device.

FIG. 6 is a view showing an installation mode of the mold M1 to the die carrier 9 and a camera (for example, a CCD camera) 25 included in the positional relationship detecting device 11.

In a center portion of the die carrier 9, a hole 23 penetrating in the Z-axis direction is provided. The flat-plate mold M1 is provided so as to cover a lower end of the hole 23. The ultraviolet light generated by the UV light generator passes through the hole 23, is transmitted through the mold M1 and reaches the transfer material W2. The mold M1 has its side surfaces supported by a mold holding member 17. Moreover, one end portion of the side surfaces is pressed by an actuator 21 such as a piezoelectric element through a shoe 16. Thus, the mold M1 is biased upward and provided integrally with the die carrier 9. Note that, when the mold M1 does not transmit the ultraviolet light, ultraviolet irradiation is performed through the substrate carrier 5, for example.

In FIG. 6, for convenience of explanation, the mold M1 is pressed (compressed) in the X-axis direction by the actuator 21. However, the mold M1 is actually compressed in the Y-axis direction by the actuator 21. Moreover, in FIGS. 6 and 7, the transfer and the like are performed continuously in the X-axis direction to form micropatterns continuously connected in the X-axis direction on the substrate W1 as shown in FIGS. 4 ($b$) and 5.

Moreover, as to the mold M1 compressed in the Y-axis direction by the actuator 21, its dimension in the Y-axis direction is DY1 in a normal state as shown in FIG. 10. By increasing a voltage to be applied to the piezoelectric element (actuator) 21 above a voltage in the normal state, the mold M1 is shrunk by elastic deformation to a dimension DY2 smaller than the dimension DY1. On the other hand, by lowering the voltage to be applied to the piezoelectric element 21 below the voltage in the normal state, the mold M1 is elongated by elastic deformation to a dimension DY3 larger than the dimension DY1. Therefore, by accordingly changing a value of the voltage to be applied to the piezoelectric element 21 under the control of the control device, the dimension of the mold M1 in the Y-axis direction can be accordingly changed and maintained.

The positional relationship detecting device 11 includes the camera 25 as described above. The camera 25 is provided integrally with the die carrier 9 inside the hole 23 in the die carrier 9 by use of an unillustrated bracket, for example. The camera 25 is capable of observing the substrate W1 through the mold M1. To be more precise, the camera 25 is capable of observing a connection between one of the first group of transfers TR1 and one of the second group of transfers TR2, which is performed continuously with the one or the first group of transfers TR1.

To be more specific, as shown in FIG. 7 ($a$), assuming that a micropattern is formed on the substrate by a first transfer TR1$a$ of the first group and a micropattern is formed on the substrate by a second transfer TR1$b$ of the first group, the camera 25 is capable of observing portions of connections between the second group of transfers TR2 to be performed and the micropatterns TR1$a$ and TR1$b$ and a portion therearound (portions P1 to P3 shown in FIG. 7 ($a$)).

In the case of observing the portion P1, for example, light intensities can be detected along a line A, a line B (overlapping portion) and a line C as shown in FIG. 7 ($b$). In the case of attempting to manufacture the substrate W1$a$ having the micropattern as shown in FIG. 4 (b) or FIG. 5, the light intensities detected along the lines A to C are as shown in FIG. 8.

Each of the light intensities along the lines A to C is in a rectangular waveform as shown in FIG. 8 (a) in a normal state. However, when a position of a micropattern (transfer pattern on the mold M1) to be formed is shifted relative to the micropattern TR1a by, for example, .DELTA.Y as shown in FIG. 8 (b), the light intensity along the line A and the light intensity along the line C are approximately combined. Thus, the light intensity along the line B does not have a uniform one-stage rectangular waveform but a two-stage rectangular waveform.

Note that the portions P2 and P3 are approximately the same as the case of the portion P1.

Having detected, based on a signal received from the camera 25, that the light intensities in the portions P1 and P2 do not have a rectangular shape as shown in FIG. 8 (b), the control device accordingly controls the XY 8 stage 7 to correct (compensate) the position of the substrate W1 relative to the mold M1 so that the light intensities in the portions P1 and P2 have the rectangular shape as shown in FIG. 8 (a).

Moreover, having detected, based on a signal received from the camera 25, that the light intensity in the portion P3 does not have the rectangular shape as shown in FIG. 8 (b), the control device controls the voltage to be applied to the piezoelectric element 21 to appropriately compensate the dimension of the mold M1 in the Y-axis direction.

Incidentally, the positional relationship detecting device 11 may have another configuration.

Specifically, in the transfer apparatus 1 shown in FIG. 1 the positional relationship detecting device 11 may include a thin plate-like detector 15. A thickness direction of the detector 15 is the Z-axis direction. Moreover, the positional relationship detecting device 11 may be configured to detect a positional deviation amount of the substrate W1 (the transfer material W2) relative to the mold M1 by inserting the detector 15 between the mold M1 and the substrate W1 (the transfer material W2) before execution of transfer.

In the case of inserting the detector 15 between the mold M1 and the substrate W1 (the transfer material W2) to detect the positional deviation amount, it is preferable that the detector 15 is inserted between the mold M1 and the substrate W1 (the transfer material W2) in a state where there is hardly any dimensional allowance since the mold M1 and the substrate W1 (the transfer material W2) come as close as possible to each other.

For example, in the case of inserting the detector 15 between the mold M1 and the substrate W1 (the transfer material W2) to detect the positional deviation amount, it is preferable that a distance L3 between the detector 15 and the mold M1 is about 0.5 mm to 3 mm and a distance L5 between the detector 15 and the transfer material W2 is also about 0.5 mm to 3 mm. Moreover, it is preferable that a thickness (dimension in the Z-axis direction) of the detector 15 is minimized at least in a portion positioned between the mold M1 and the substrate W1 (the transfer material W2).

The positional relationship detecting device 11 will be described in more detail by giving examples.

The detector 15 in the positional relationship detecting device (positional deviation amount detecting device) 11 is movable between a first position (see the detector 15 indicated by a solid line in FIG. 1) where the detector 15 is inserted between the mold M1 and the substrate W1 (the transfer material W2) when the mold M1 and the substrate W1 (the transfer material W2) are away from each other by a predetermined distance and a second position (see the detector 15 indicated by a chain double-dashed line in FIG. 1) away from the mold M1 and the substrate W1 (the transfer material W2), which allows the mold M1 and the substrate W1 (the transfer material W2) to come into contact with each other.

Here, the detector 15 is integrally provided to a first detector supporting member 29 at a tip portion of the first detector supporting member 29. The first detector supporting member 29 is provided to a second detector supporting member 31 through a linear guide bearing (not shown) so as to be movable relative to the second detector supporting member 31 in the X-axis direction. Moreover, under the control of the control device, the detector 15 is moved between the first position (position indicated by the solid line in FIG. 1) where the detector is inserted between the mold and the substrate and the second position (position indicated by the chain double-dashed line in FIG. 1) away from the mold and the substrate by an actuator (not shown) such as a pneumatic cylinder.

The second detector supporting member 31 is provided to the base frame 3 through a linear guide bearing (not shown) so as to be movable in the Z-axis direction relative to the base frame 3. Moreover, the second detector supporting member 31 is freely moved and positioned in the vertical direction by an actuator (not shown) such as a servo motor and a ball screw (not shown) under the control of the control device.

Therefore, the position of the detector 15 in the Z-axis direction can be adjusted according to the configurations of the mold M1 and the substrate W1 (the transfer material W2).

To be more specific, the positional relationship detecting device 11 includes a camera (not shown). This camera is provided in a position away from the detector 15 (for example, in the first detector supporting member 29). Moreover, a prism (not shown) is provided in the detector 15. The positional relationship detecting device 11 is configured to detect a positional deviation in the substrate W1 (the transfer material W2) or the mold M1 by use of the camera through the prism. Specifically, light traveling in the Z-axis direction from the substrate W1 (the transfer material W2) or the mold M1 is reflected by the prism so as to travel in the X-axis direction, for example. The camera takes in the reflected light. Note that the thickness of the detector 15 described above includes a thickness of the prism. Moreover, a reflecting mirror or the like may be provided instead of the prism.

The configuration using the detector 15 as described above enables detection of the positional deviation in the substrate W1 (the transfer material W2) or the mold M1 even when the mold M1 is made of metal or the like and is not transparent.

Accordingly, in the step of forming the micropattern on the substrate W1 shown in FIG. 3, a positional relationship between a micropattern formed on the substrate W1 by the first group of transfers and the like and a transfer micropattern formed on the mold M1 before execution of the second group of transfers is detected by using the detector 15 and the like in the positional relationship detecting device 11 after the micropattern is formed on the substrate W1 by the first group of transfers and the like shown in FIG. 3 (b) and before the second group of transfers is performed, as in the case of using the camera 25 described above and the like. To be more specific, the positional relationship between the micropattern formed on the substrate W1 and the micropattern formed on the mold M1 in the state shown in FIG. 3 (c) is detected.

Moreover, the correction device 13 corrects a position of the mold M1 relative to the substrate W1, based on a detection result on the positional relationship, so as to accurately connect the transfer micropattern to be formed by the second micropattern forming step to the micropattern formed on the substrate W1 by the first group of transfers and the like.

Specifically, a relative positional relationship between the substrate W1 and the mold M1 in the state shown in FIG. 3 (c) is set to be accurate.

Furthermore, in the correction of the position of the mold M1 relative to the substrate W1 by controlling the actuator 21 in the transfer apparatus 1, a change in shape of the mold M1 due to a temperature change, for example, is compensated to achieve an accurate shape of the mold M1.

Here, with reference to FIG. 7, more detailed description will be given of the correction and the like in the step of forming the micropattern on the substrate W1 shown in FIG. 3 by giving examples.

First, by the first group transfer step and micropattern forming step, micropatterns are formed in a first portion TR1a of the transfer material W2 and in a second portion TR1b away from the first portion TR1a by a predetermined distance.

Subsequently, by the second group transfer step and micropattern forming step, a micropattern is formed in a third portion TR2 between the first and second portions TR1a and TR1b, the third portion TR2 continuously connecting the first and second portions TR1a and TR1b.

Here, as described above, the positional relationship detecting device 11 detects a positional deviation amount of a transfer micropattern formed on the mold M1 relative to the first portion TR1a at a boundary between the first portion TR1a and the transfer micropattern on the mold M1 and a positional deviation amount of the transfer micropattern formed on the mold M1 relative to the second portion TR1b at a boundary between the second portion TR1b and the transfer micropattern on the mold M. Thereby, the positional relationship detecting device 11 detects a positional relationship between the micropattern formed by the first group micropattern forming step and the transfer micropattern formed on the mold (the mold located at a position for performing a second group of transfers) M1.

To be more specific, the portion of the mold M1 having the transfer micropattern formed therein is formed to have a rectangular planar shape. By arranging the first portion TR1a, the third portion TR2 and the second portion TR1b in a straight line, a micropattern is formed within a rectangular range.

The positional relationship detecting device 11 detects, on one side in a width direction of the rectangular micropattern, a relative positional deviation amount (the positional deviation amount of the transfer micropattern on the mold M1 relative to the first portion TR1a) in the portion P1 at the boundary between the first portion TR1a and the transfer micropattern formed on the mold M1 and a relative positional deviation amount (the positional deviation amount of the transfer micropattern on the mold M1 relative to the second portion TR1b) in the portion P2 at the boundary between the second portion TR1b and the transfer micropattern formed on the mold M1.

Moreover, the positional relationship detecting device 11 detects, on the other side in the width direction of the rectangular micropattern, a relative positional deviation amount (the positional deviation amount of the transfer micropattern on the mold M1 relative to the second portion TR1b) in the portion P3 at the boundary between the second portion TR1b (or the first portion TR1a) and the transfer micropattern formed on the mold M1.

The correction device 13 compensates the position and posture of the substrate W1 by use of the XY .theta. stage 7 based on the positional deviation amounts on one side (the portions P1 and P2) in the width direction and the positional deviation amount on the other side (the portion P3) in the width direction. Moreover, the correction device 13 also compensates the dimension of the mold M1 in the width direction by using the actuator 21 to change an elastic deformation amount of the mold M1 in the width direction in the rectangular micropattern.

Note that, as shown in FIGS. 4 (b) and 11 (a), in the case of forming a micropattern extending in the longitudinal direction (X-axis direction, a horizontal direction in FIG. 11 (a)), the position of the mold M1 relative to the substrate W1 may be corrected by a correction, for example, in the Y-axis direction, in a rotation amount around the Z axis and a correction using the actuator 21 if necessary in the second group of transfers TR2.

On the other hand, as shown in FIGS. 4 (a) and 11 (b), in the case of forming a micropattern extending in the width direction (Y-axis direction, a vertical direction in FIG. 11 (b)) on the substrate W1, the position of the mold M1 relative to the substrate W1 may be corrected by a correction, for example, in the X-axis direction, in a rotation amount around the Z axis and a correction using the actuator 21 if necessary in the second group of transfers TR2.

Moreover, in the above description, the positional relationship is detected by comparing the position of the micropattern formed on the substrate W1 with the position of the micropattern on the mold M1. However, eye marks may be put on the substrate W1 and the mold M1, and these eye marks may be photographed by a camera or the like to detect a positional relationship thereby performing a correction.

For example, as shown in FIG. 9 (a), eye marks MM1 to MM4 are put on four corners of the mold M1. Note that the transfer micropattern is assumed to be provided in a region TRS2 inside the eye marks MM1 to MM4.

When a micropattern is formed by performing a first group of transfers TR1 on a substrate W4, eye marks MW1 to MW4 corresponding to the eye marks MM1 to MM4 on the mold M1 are put on the substrate W4 together with the micropattern. Thereafter, in execution of a second group of transfers TR2, positional deviation amounts between the eye marks MW2 and MW4 on the substrate W4 and the eye marks MM1 and MM3 on the mold M1 are detected. Thus, a positional deviation in the mold M1 (the substrate W4) may be corrected when the second group of transfers TR2 is to be performed relative to the position of the first group of transfers TR1.

Moreover, as shown in FIG. 9 (b), eye marks MW6 to MW11 may be previously put on a substrate W4a before formation of a transfer micropattern. Note that the transfer micropattern is formed in a region TRS1 inside the eye marks MW6 to MW11.

In execution of the first group of transfers TR1, a positional deviation in the mold M (the substrate W4a) may be corrected by detecting positions of at least two of the eye marks MW6 to MW9 and detecting a positional deviation amount of the mold M1 to the substrate W4a based on a result of the above detection. Also in execution of the second group of transfers TR2, as in the case of the execution of the first group of transfers TR1, a positional deviation in the mold M1 (the substrate W4a) may be corrected by detecting positions of at least two of the eye marks MW7, MW9, MW10 and MW11 and detecting a positional deviation amount of the mold M1 to the substrate W4a based on a result of the above detection.

Furthermore, in the case shown in FIG. 9 (b), a positional deviation in the mold M1 (the substrate W4a) may be corrected by providing eye marks also on the mold M1 and detecting positional deviation amounts between the eye marks previously provided on the substrate W4a and the eye marks provided on the mold M1.

Incidentally, as already understood, the transfer apparatus 1 is an apparatus used for transferring a transfer micropattern on the mold M1 onto the transfer material W2 by pressing the mold M1 against the substrate W1 as shown in FIGS. 3 (a) and 3 (c). Therefore, different apparatuses are used for covering the surface of the substrate W1 with a film of the transfer material W2 or for forming a micropattern on the substrate W1 by etching and removing the transfer material W2 as shown in FIGS. 3 (b) and 3 (d). In this event, the substrate W1 is removed from the transfer apparatus 1.

Figure 14:
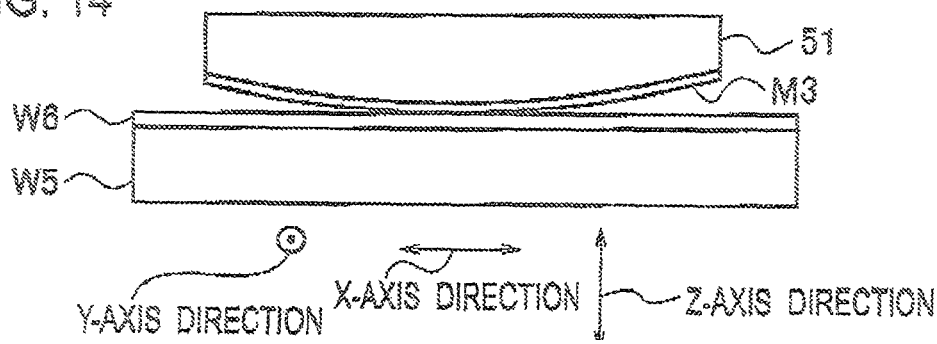
FIG. 14 is a view showing a state of forming connected micropatterns on a to-be-molded object.

As shown in FIGS. 4 (a) and 4 (b), by using the substrate W1 (W1a) having the transfer micropattern formed on its rectangular surface as a die M3, the micropattern on the die M3 may be transferred onto a layer to be molded (for example, an ultraviolet curable resin, a thermoplastic resin or the like) W6 provided on an to-be-molded object (for example, silicon, glass or the like) W5 (see FIG. 14). In this case, the substrate W1 (W1a) may be used as it is as the mold. Alternatively, a nickel mold may be manufactured (formed) by electroforming, for example, as described above from the substrate W1 (W1a) and transfer may be performed by use of the nickel mold.

Furthermore, in execution of the transfer using the die M3, it is preferable to perform the transfer as follows. As shown in FIG. 14, a portion (surface) of the die M3 having the micropattern formed therein is formed into a convex surface shape formed by using a part of a lateral surface of a cylinder in such a manner that a longitudinal direction of the portion is set as a circumferential direction of the cylinder and a width direction of the surface is set as a height direction of the cylinder. Moreover, the transfer is performed by moving a linear pressing portion (extended in a direction perpendicular to the page space of FIG. 14) of the convex surface pressed against the to-be-molded object W5 (the to-be-molded layer W6) from one end to the other end of the convex surface in its longitudinal direction (for example, by moving the linear pressing portion from the left-side end to the right-side end in FIG. 14).

Moreover, the similar transfer may be performed by forming the portion (surface) of the die M3 having the micropattern formed therein into a convex surface shape formed by using a part of a lateral surface of an elliptic cylinder, in such a manner that the longitudinal direction of the portion is set as a circumferential direction of the elliptic cylinder and the width direction of the surface is set as a height direction of the elliptic cylinder.

Figure 13:
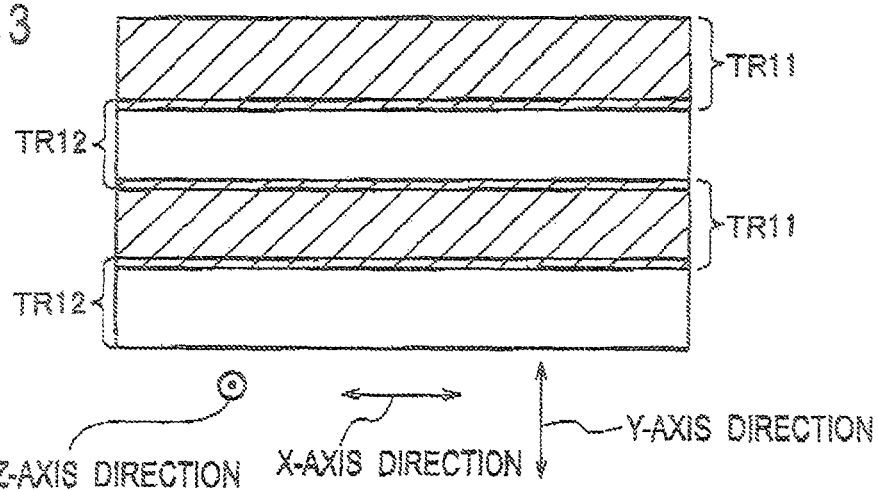
FIG. 13 is a view showing a state of forming connected micropatterns on the substrate.

Furthermore, after the first transfer shown in FIG. 14 is performed, the similar transfer may be performed by moving the die M3 in a width direction (direction perpendicular to the page space of FIG. 14) of the micropattern on the die M3 relative to the to-be-molded object W5 (the to-be-molded layer W6) so as to perform transfer, onto the to-be-molded layer W6 on the to-be-molded object W5, in which the micropattern on the die M3 is connected in the width direction (see FIG. 13).

Here, description will be given of a transfer apparatus 1a for performing transfer using a convex surface in the shape of a lateral surface of a cylinder as shown in FIG. 14.

The transfer apparatus 1a is different from the transfer apparatus 1 described above in that a lower surface of a die carrier 51 for holding the die M3 is formed in the shape of a lateral surface of a cylinder and the die carrier 51 is swung around a predetermined axis CL1. However, other configurations are almost the same as that of the transfer apparatus 1 described above.

Figure 15:
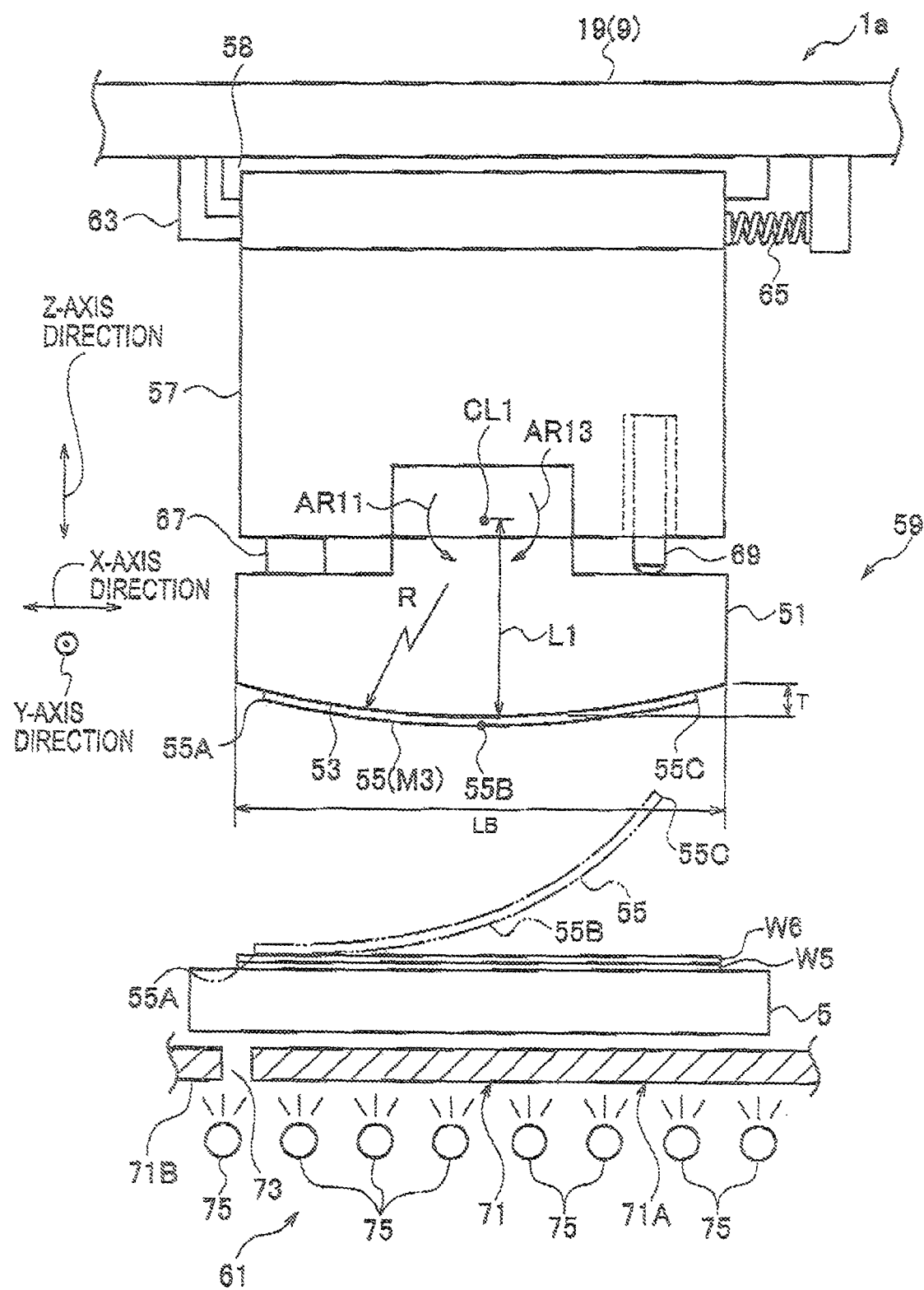
FIG. 15 is a view showing a main part of the transfer apparatus for performing transfer shown in FIG. 14.

FIG. 15 is a view showing a main part of the transfer apparatus 1a.

The transfer apparatus 1a will be described in detail. Between a substrate carrier (substrate table) 5 and a movable member 19 (equivalent to the die carrier 9 in the transfer apparatus 1), the die carrier 51 is provided. The die carrier 51 has a convex surface 53 at its bottom. The convex surface 53 faces, in an approximately parallel state, an upper surface of a to-be-molded object (on which a to-be-molded layer W6 is provided) W5 held by the substrate carrier 5, the upper surface being a surface on one side in a thickness direction.

The convex surface 53 is formed by using a part of a lateral surface of a cylinder. Note that the cylinder does not have to have a complete cylindrical shape but may have a shape close to the cylindrical shape, for example, an elliptic cylindrical shape. Furthermore, the convex surface 53 may be formed by using a part of a lateral surface of a columnar solid (a solid formed by a trajectory of a plane having a predetermined shape, such as a circle and an ellipse, when the plane having the predetermined shape is moved by a predetermined distance in a direction perpendicular to the plane).

The convex surface 53 of the die carrier 51 will be described in more detail. The convex surface 53 has a shape of a small-area surface among four surfaces (two large-area surfaces and two small-area surfaces) obtained by cutting the lateral surface of the cylinder by a first plane including a central axis (extended in a height direction of the cylinder) of the cylinder and a second plane which includes the central axis of the cylinder and intersects with the first plane at a small angle.

Note that the convex surface 53 has a shape close to a plane since a diameter of the cylinder is large and the intersecting angle is small. Assuming that an extended axial direction (direction perpendicular to the sheet surface of FIG. 2) of the central axis of the cylinder is a length direction of the convex surface 53 and a circumferential direction (approximately horizontal direction in FIG. 15) of the lateral surface of the cylinder is a width direction of the convex surface 53, a center portion of the convex surface 53 protrudes only by about 0.1 mm (T) to a width B of 300 mm, for example, as shown in FIG. 15.

Accordingly, the cylinder has a large radius such that a proportion of a protrusion amount T of the center portion of the convex surface 53 to the with B of the convex surface 53 is, for example, "1/100000 to 1/3000". Specifically, the radius of the cylinder has a value as large as 125 to 2750 times the width B of the convex surface 53.

Moreover, a die 55 (the die M3) for transfer is allowed to follow the convex surface 53 and can be held by vacuum adsorption, for example. The die 55 is formed by Ni electroforming molding as described above in the shape of a thin rectangular flat plate. An ultra micropattern for transfer is formed on one surface (a lower side in FIG. 15) of the die 55.

Note that the radius of the cylinder may be such that a proportion of the protrusion amount T of the center portion of the convex surface 53 to the width B of the convex surface 53 is "1/3000 to 1/30". In other words, the radius of the cylinder may have a value 3 to 125 times the width B of the convex surface 53. For example, when the width B of the convex surface 53 is 300 mm, the protrusion amount T may be increased to about 10 mm.

Moreover, the die carrier 51 is supported by the movable member 19 through a movable member 57 and is movable relative to the substrate carrier 5 in a direction (vertical direction, the Z-axis direction) of coming close to and separating from the substrate carrier 5 along with the movement of the movable member 19.

Note that, although the die carrier 51 and the die 55 are separate from each other in the above description, the die carrier 51 and the die 55 may be integrated with each other. In other words, a transfer pattern may be provided directly on the convex surface 53 of the die carrier 51.

Moreover, pressing means 59 is provided in the transfer apparatus 1a. The pressing means 59 is used for allowing the die 55 held by the die carrier 51 to come close relative to the to-be-molded object W5 (the to-be-molded layer W6) held by the substrate carrier 5, pressing the to-be-molded object W5 (the to-be-molded layer W6) with the die 55 and thus transferring transfer pattern on the die 55 onto the to-be-molded layer W6 on the to-be-molded object W5.

The pressing means 59 is configured to press the to-be-molded object W5 (the to-be-molded layer W6) with the die 55 by moving a linear pressing portion parallel to the central axis of the cylinder from one end to the other end of the convex surface 53 (from the left side to the right side in FIG. 15).

Note that the pressing portion is extended in the length direction of the convex surface 53 (in the direction perpendicular to the sheet surface of FIG. 15). Moreover, the pressing portion is formed between a part of a surface of the die 55 having the transfer pattern formed thereon, the die 55 being held by the convex surface 53 of the die carrier 51; and a surface of the to-be-molded object W5 (the to-be-molded layer W6) that comes into contact with the part of the surface. The pressing portion actually has a certain width (width in the horizontal direction in FIG. 2).

Moreover, in the transfer apparatus 1a, UV (ultraviolet) irradiation means 61 is provided, which irradiates, with UV (ultraviolet) light, a pressed portion (including the vicinity of the pressed portion) that is being pressed by the pressing means 59 or the pressed portion that is being pressed by the pressing means 59 and a portion already pressed by the pressing means 59. Note that a portion of the to-be-molded layer W6 which is yet to be pressed is irradiated with no ultraviolet light in order to prevent curing before pressing.

The transfer apparatus 1a will be described in more detail. The substrate carrier 5 holds the to-be-molded object W5 (the to-be-molded layer W6) having the shape of a rectangular flat plate on a rectangular plane (upper surface) of the substrate carrier 5 extended in the X-axis and Y-axis directions. The to-be-molded object W5 (the to-be-molded layer W6) includes the to-be-molded object W5 having the shape of a rectangular flat plate and the thin-film to-be-molded layer W6 having a transfer pattern formed on one surface in the thickness direction of the to-be-molded object W5. The to-be-molded object W5 (the to-be-molded layer W6) is held on the upper surface of the substrate carrier 5 in such a manner that the surface on which the to-be-molded layer W6 is provided faces up (in such a manner that a lower surface opposite to the surface on which the to-be-molded layer W6 is provided comes into contact with the upper surface of the substrate carrier 5.

Below the movable member 19, the different movable member 57 is provided. This movable member 57 is movable in the X-axis direction to the movable member 19 through a linear guide bearing 58. Moreover, at one end (the left-side end in FIG. 15) of the movable member 57 in the X-axis direction, a stopper 63 is provided, with which the movable member 57 comes into contact. Moreover, at the other end of the movable member 57 in the X-axis direction, biasing means such as a compression spring 65 for biasing the movable member 57 toward the stopper 63 (leftward in FIG. 15) is provided.

Inside (upper side in FIG. 15, the side where an unillustrated central axis of the cylinder exists relative to the convex surface 53) the convex surface 53 of the die carrier 51 and in an intermediate portion (for example, in an approximately center portion in the X-axis direction) of the convex surface 53, a swinging central axis CL1 is provided. This swinging central axis CL1 is a straight line extended in the Y-axis direction. The die carrier 51 is supported so as to be swingable to the movable member 57 about the swinging central axis CL1.

Note that the swinging central axis CL1 is positioned close to the convex surface 53. Specifically, the swinging central axis CL1 is positioned close to the convex surface 53, the position being on the convex surface 53 side between the central axis of the cylinder and the convex surface 53. To be more specific, as shown in FIG. 15, a distance L1 between the convex surface 53 and the swinging central axis CL is set smaller than the width B of the convex surface 53. Note that the distance L1 may be set equal to or slightly larger than the width B.

Incidentally, when the convex surface 53 is formed by using a part of a lateral surface of an elliptic cylinder, the convex surface 53 is formed of a convex surface having a larger curvature radius between two kinds of convex surfaces obtained by cutting the lateral surface of the elliptic cylinder by two planes (placed at positions symmetrical to each other about the central axis extended in a height direction of the elliptic cylinder) which are parallel to the short axis of the ellipse, extended in the height direction of the elliptic cylinder and away from each other.

The swinging central axis of the convex surface formed by using a part of the lateral surface of the elliptic cylinder is also positioned close to the convex surface as in the case of the convex surface 53 formed by using a part of the lateral surface of the cylinder. Note that the swinging central axis of the convex surface formed by using the elliptic cylinder may be allowed to coincide with the central axis of the elliptic cylinder by increasing a difference between the long and short axes of the elliptic cylinder.

Between the die carrier 51 and the movable member 57, biasing means and an actuator are provided. The biasing means is formed of, for example, a disc spring 67 provided on the left side in FIG. 15. The biasing means biases the die carrier 51 so as to swing the die carrier 51 in one direction (direction indicated by an arrow AR11 in FIG. 15) about the swinging central axis CL1. On the other hand, the actuator is formed of, for example, a piezoelectric element 69 provided on the right side in FIG. 15. When a voltage is applied to the piezoelectric element 69 and the voltage is gradually increased under the control of a control device (not shown) in the transfer apparatus 1a, the piezoelectric element 69 is gradually extended and, the die carrier 51 is swung in the other direction (direction indicated by an arrow AR13 in FIG. 15) about the swinging central axis a1 even though the mold carrier is biased by the disc spring 67.

Note that an actuator such as a motor may be used instead of the piezoelectric element. To be more specific, the die carrier 51 may be swung by using a servo motor to rotate a nut of a ball screw thereby linearly moving a threaded shaft of the ball screw.

In the case of pressing the to-be-molded object W5 (the to-be-molded layer W6) with the die 55 to perform transfer onto the to-be-molded object W5 (the to-be-molded layer W6), first, the die 55 is lifted to be away from the to-be-molded object W5 (the to-be-molded layer W6), and the piezoelectric element 69 is turned off (is set in a state where no voltage is applied thereto). Note that, in FIG. 15, a center portion 55B of the die 55 is the lowest among the portions of the die 55. However, in an off-state of the piezoelectric element 69, a left end (where the disc spring 67 is provided) 55A of the die 55 becomes the lowest among the portions of the die 55 by the biasing force of the disc spring 67.

In the state where the left end 55A of the die 55 is the lowest as described above, the movable member 19 is lowered until the left end 55A of the die 55 comes into contact with the to-be-molded object W5 (the to-be-molded layer W6) with a predetermined pressure. As a result, the die 55 is located at a position indicated by a chain double-dashed line in FIG. 15. Here, when the piezoelectric element 69 is turned on (voltage is applied thereto) and is gradually extended, the die 55 (the die carrier 51) is swung. Accordingly, a contact position (a pressing position by the die 55) between the die 55 indicated by the chain double-dashed line in FIG. 15 and the to-be-molded object W5 (the to-be-molded layer W6) is moved from the left to the right in FIG. 15. Eventually, a right end 55C of the die 55 becomes the lowest and comes into contact with the to-be-molded object W5 (the to-be-molded layer W6)

When the contact position (pressing portion) between the die 55 and the to-be-molded object W5 (the to-be-molded layer W6) is moved from the left to the right in FIG. 15, feedback control based on pressing force detected by an unillustrated load cell (capable of measuring pressing force of the die 55 against the to-be-molded object W5 (the to-be-molded layer W6), pressing force detecting means) is performed to maintain the pressing force of the die 55 against the to-be-molded-object W5 (the to-be-molded layer W6) at a constant value. Thus, torque of an unillustrated servo motor (for driving the movable member 19) is controlled by the control device.

Moreover, when the contact position (pressing portion) between the die 55 and the to-be-molded object W5 (the to-be-molded layer W6) is moved from the left to the right in FIG. 15, a height position of the movable member 19 is accordingly changed. Thus, even though the central axis of the cylinder and the swinging central axis CU of the die carrier 51 including the convex surface 53 do not coincide with each other, the pressing portion can be smoothly moved from the left to the right in FIG. 15.

By using a fluid pressure cylinder such as a pneumatic cylinder instead of the servo motor and controlling a pressure of a fluid supplied to the cylinder, the pressing force of the die 55 against the to-be-molded object W5 (the to-be-molded layer W6) can be maintained at a constant value as in the case of the feedback.

Note that, in FIG. 15, the swinging central axis CL1 is placed in the center portion in the X-axis direction, the disc spring 67 is placed on one side and the piezoelectric element 69 is placed on the other side. However, the swinging central axis CL1 may be placed on the one side and the disc spring 67 and the piezoelectric element 69 may be placed on the other side.

Furthermore, as described above, the movable member 57 is moved in the X-axis direction to the movable member 19. Thus, when the to-be-molded object W5 (the to-be-molded layer W6) is pressed by lowering the movable member 19 and swinging the die carrier 51 (the die 55) with the piezoelectric element 69, the movable member 57 is moved away from the stopper 63 despite being biased by the spring 65. Thus, the position of the swinging central axis CL1 is slightly moved relative to the to-be-molded object W5 (the to-be-molded layer W6) in a direction (rightward in FIG. 15) of the movement of the pressing portion.

The movement of the swinging central axis CL1 can prevent problems (for example, deformation of a pattern to be transferred onto the to-be-molded layer W6 due to a small positional deviation in the movement direction (X-axis direction) of the pressing portion between the transfer pattern on the die 55 and the to-be-molded layer 1W6) which are caused when a distance of the movement of the pressing portion in the die 55 is longer than a distance of the movement of the pressing portion in the flat-plate to-be-molded object W5 (the to-be-molded layer W6).

Next, the UV (ultraviolet light) irradiation means 61 will be described.

Below the substrate carrier 5, a shutter 71 in the form of a flat plate is provided. In the shutter 71, a slit 73 extended in the Y-axis direction is provided. The slit 73 divides the shutter 71 into a right-side portion 71A and a left-side portion 71B as shown in FIG. 15. The shutter 71 is guided by an unillustrated guide member and moved in the X-axis direction by an unillustrated actuator such as a servo motor. Accordingly, the slit 73 is also moved in the X-axis direction.

Moreover, below the shutter 71, UV light sources (UV lights) 75 are provided. In a state where the UV lights 75 are turned on, the shutter 71 is moved in synchronization with the movement of the pressing portion under the control of the control device. Accordingly, only a portion where the to-be-molded object W5 (the to-be-molded layer W6) is pressed by the die 55 is irradiated with UV tight. Note that, if the left-side portion 71B of the shutter 71 is removed, a portion that is being pressed and the already pressed portion are irradiated with UV light.

In the case of moving the shutter 71 in synchronization with the movement of the pressing portion, the shutter 71 is moved according to the value of the voltage to be applied to the piezoelectric element 69, for example.

By using the transfer apparatus 1a and the die M3 described above, transfer onto the to-be-molded layer W6 and formation of a micropattern on the to-be-molded object W5 may be performed in the same manner as the case shown in FIG. 3. In this case, as shown in FIG. 13, a micropattern is formed in a portion TR11 of the to-be-molded object W5 by the first group of transfers and the like and the micropattern is formed in a portion TR12 of the to-be-molded object W5 by the second group of transfers and the like. Therefore, a micropattern obtained by two-dimensionally extending the transfer micropattern originally formed on the mold M1 is continuously formed on the to-be-molded object W5 through the die M3.

Figure 12:
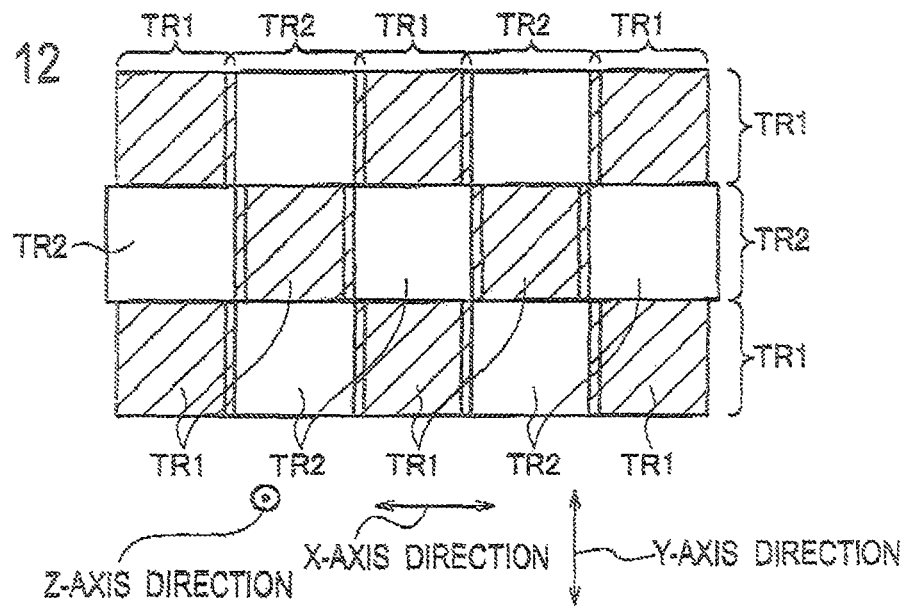
FIG. 12 is a view showing a state of forming connected micropatterns on the substrate.

Incidentally, micropatterns as shown in FIG. 12 may be formed by using the steps shown in FIG. 3. Specifically, micropatterns are formed in portions (TR1 portions indicated by diagonal lines in FIG. 12) of the substrate W1, the portions corresponding to portions of one color of a checkered pattern, by the first group of transfers and micropattern formation. Moreover, micropatterns are formed in portions (TR2 portions shown in FIG. 12) of the substrate, the portions corresponding to portions of the other color of the checkered pattern, by the second group of transfers and micropattern formation.

When the micropatterns are formed as described above, some portions of the substrate W1 corresponding to the portions of the one color of the checkered pattern are adjacent to each other. However, the portions are adjacent to each other at their corners, in other words, the portions are not in a line contact state but in a point contact state. Thus, even if the transfer material W2 swells up due to the transfer, there is hardly any influence of the swelling. Thus, accurate transfer onto the transfer material W2 can be executed.

Figure 16:
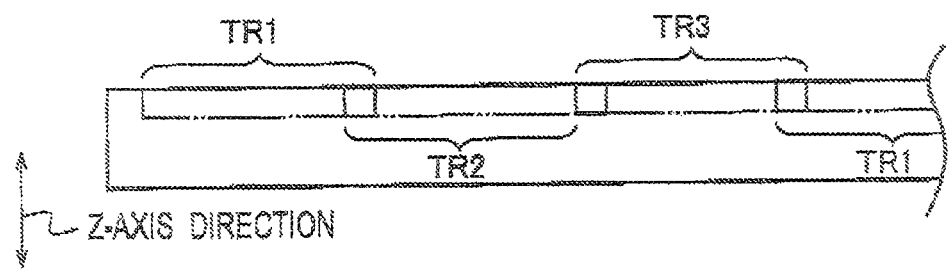
FIG. 16 is a view showing a modified example in a case where connected micropatterns are formed on a to-be-molded object.

Furthermore, as shown in FIG. 16, micropatterns may be continuously formed on the substrate by multiple groups of steps, such as a third group of transfers and formation of micropatterns TR3, in addition to the first group of transfers and the formation of the micropatterns TR1 as well as the second group of transfers and the formation of the micropatterns TR2.

Figure 17:
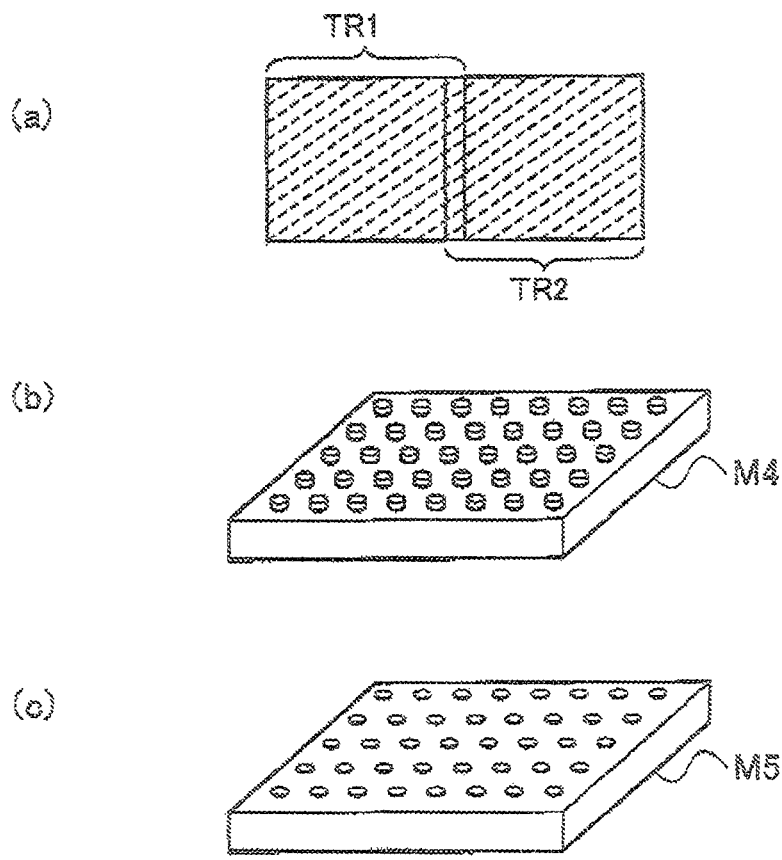
FIGS. 17 (a) to 17 (c) are views showing modified examples of the mold.

Moreover, the transfer micropattern on the mold M1 May be obliquely extended as shown in FIG. 17 (*a*). A transfer micropattern on a mold M4 may be formed of multiple minute cylindrical (or square columnar or the like) protrusions as shown in FIG. 17 (*b*). Alternatively, a transfer micropattern on a mold M5 may be formed of multiple minute cylindrical (or square columnar or the like) holes as shown in FIG. 17 (*c*). The protrusions or the holes may have the same size or different sizes from each other.

Figure 18:
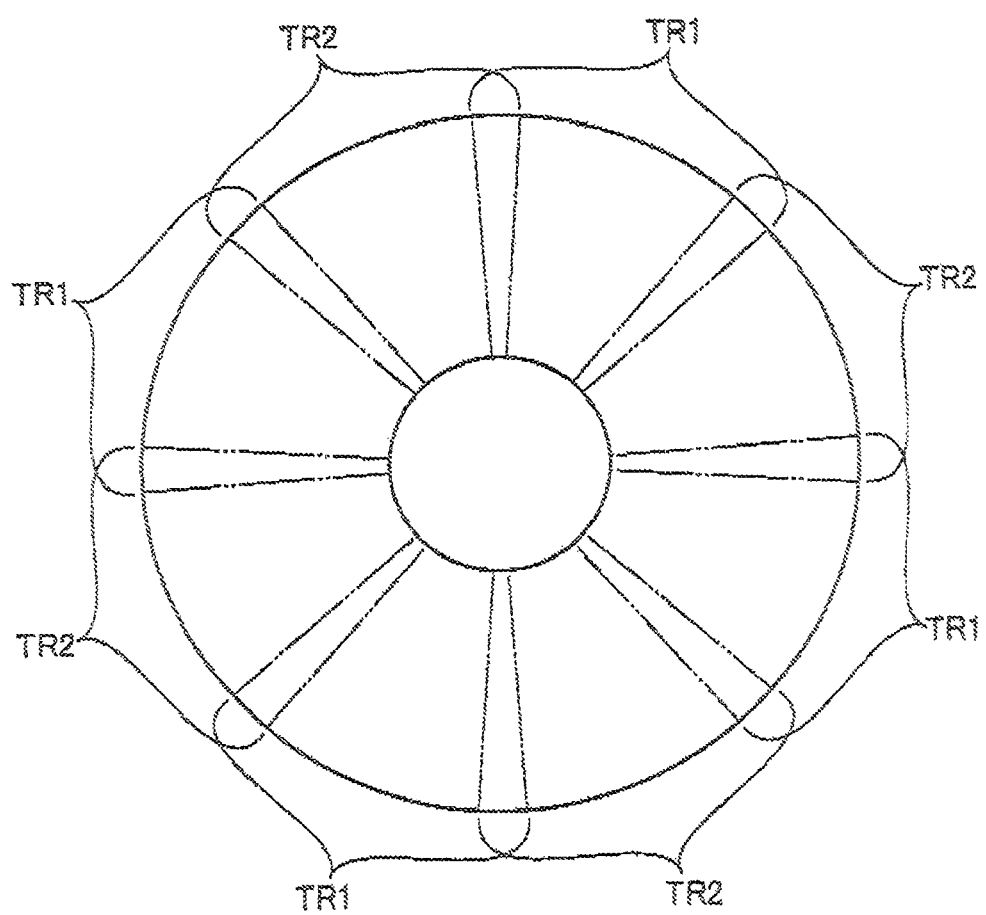
FIG. 18 is a view showing a modified example in a case where connected micropatterns are formed on the to-be-molded object.

Moreover, as shown in FIG. 18, continuous micropatterns may be formed on a disk-shaped substrate by the first group of transfers and formation of micropatterns TR1 as well as the second group of transfers and formation of micropatterns TR2.

Note that the micropattern forming method according to the first embodiment is an example of a micropattern forming method for continuously forming micropatterns on a substrate, the micropatterns each corresponding to a transfer micropattern formed on a mold. The micropattern forming method includes: a covering step of covering a surface of the substrate with a film of a transfer material; a transfer step of transferring the transfer micropattern at predetermined intervals in a plurality of spots on the transfer material formed in the covering step by pressing the mold more than once against a part of the substrate having the film of the transfer material provided on its surface by the covering step; a micropattern forming step of forming the micropatterns at predetermined intervals in a plurality of spots on the substrate by etching after the transfer of the micropatterns by the transfer step, the micropatterns each corresponding to the transfer micropattern on the mold; and a removal step of removing the transfer material provided in the covering step after the formation of the micropatterns by the micropattern forming step. The micropatterns each corresponding to the transfer micropattern formed on the mold are continuously formed on the substrate by repeating a cycle of the covering step, the transfer step, the micropattern forming step and the removal step in this order for multiple times while accordingly changing positions to form micropatterns in the transfer step and the micropattern forming step.

According to the micropattern forming method according to the first embodiment, after micropatterns (first micropatterns) are formed on the substrate W1 by the first (first-group) covering step, the first (first-group) transfer step and the first (first-group) micropattern forming step, the transfer material W2 formed in the first covering step is removed. After the removal, micropatterns (second micropatterns) are formed on the substrate W1 by a second (second-group) covering step, a second (second-group) transfer step and a second (second-group) micropattern forming step. Thus, in execution of the second transfer step, the transfer material W2 swelling up due to execution of the first transfer step is removed.

Therefore, even if the first and second micropatterns are connected to each other, accurate transfer can be executed in the second transfer step. Accordingly, connections between the micropatterns formed on the substrate W1 in the first micropattern forming step and the micropatterns formed on the substrate W1 in the second micropattern forming step can be accurately formed. Thus, the micropatterns having an accurate form can be continuously formed on the substrate W1.

Moreover, a position of the mold M1 relative to the substrate W1 is corrected by a correction step. Thus, the micropatterns formed on the substrate W1 by the first transfer step and the like and the micropatterns formed on the substrate W1 by the second transfer step and the like are accurately connected to each other. As a result, more accurate micropatterns can be formed on the substrate W1.

Moreover, the mold M1 changed in shape by using the actuator 21 is compensated to an accurate shape in the correction step. Thus, even if the shape of the mold M1 is changed by a temperature change or the like, accurate transfer can be executed.

Furthermore, as shown in FIGS. 14 and 15, the transfer is performed while moving the pressing portion from the one end to the other end of the convex portion of the die M3. Thus, air bubbles are less likely to be generated in the to-be-molded layer W6 on the to-be-molded object W5. Specifically, when the transfer is performed by pressing the entire planar surface of the die M3 against the to-be-molded layer W6 on the to-be-molded object W5 in the form of the flat plate, air present in the center portion of the die M3 is unlikely to escape from the periphery of the die M3 to the outside (outside of the pressing surface). Thus, air bubbles may be generated in the to-be-molded layer W6. However, by pressing the to-be-molded object W5 (the to-be-molded layer W6) while moving the pressing portion from one end to the other end of the die 55, there never arises a situation where air is unlikely to escape.

Moreover, the transfer is performed while moving the pressing portion from one end to the other end of the die M3, in other words, the to-be-molded object W5 is not simultaneously pressed by the entire surface of the die M3. Thus, the pressing force for the transfer can be reduced compared with the conventional case. As a result, accurate transfer can be performed without increasing rigidity of the apparatus to be used for the transfer.

Furthermore, when the pressing is finished, the entire surface of the mold does not adhere to the to-be-molded object unlike the conventional case but only the moved pressing portion adheres to the to-be-molded object W5 (the to-be-molded layer W6). Thus, a force to separate the to-be-molded object W5 (the to-be-molded layer W6) from the die M3 can be reduced. As a result, mold release is facilitated.

Second Embodiment

FIGS. 19 and 20 are views schematically showing steps of a micropattern forming method according to a second embodiment of the present invention.

The micropattern forming method according to the second embodiment is different from the micropattern forming method in that a lower transfer material (for example, silicon oxide) W7 and an upper transfer material (for example, ultraviolet curable resin) W2 are provided in a substrate (for example, silicon) W1 and a micropattern is formed on the substrate W1 by etching using the lower transfer material W7 as a mask material. The other points are approximately the same as the micropattern forming method according to the first embodiment.

To be more specific, in the micropattern forming method according to the second embodiment, first, a surface (for example, approximately the entire planar surface of the lower transfer material W7) of the lower transfer material W7 in the substrate W1 having its surface covered with a thin film of the lower transfer material W7 is covered with a thin film of the upper transfer material (for example, UV curable resin before being cured) W2. By this covering, the substrate W1, the lower transfer material W7 and the upper transfer material W2 are stacked.

Subsequently, a transfer micropattern is transferred onto the upper transfer material W2 by pressing a mold M1 against a part of the substrate W1 (the lower transfer material W7) having the thin film of the upper transfer material W2 provided on its surface (see FIG. 19 (a)).

By etching the lower transfer material W7 after the transfer of the micropattern onto the upper transfer material W2, a micropattern corresponding to the transfer micropattern on the mold M1 is formed only on the lower transfer material W7. Thereafter, the upper transfer material W2 is removed (see FIG. 19 (b)).

After the removal of the upper transfer material W2, surface portions of the lower transfer material W7 where the micropatterns are formed and other surface portions of the lower transfer material W7, the other surface portions being connected to the above portions, (for example, approximately the entire planar surface of the lower transfer material W7) are covered with a thin film of the upper transfer material W2.

Thereafter, a transfer micropattern is transferred onto the upper transfer material W2 by pressing the mold M1 against other portions continuously connected to the portions having the micropatterns formed therein shown in FIG. 19 (b), the other portions being a part of the substrate W1 (the lower transfer material W7) having the thin film of the upper transfer material W2 provided on its surface (see FIG. 19 (c)).

By etching the lower transfer material W7 after the transfer of the micropattern onto the upper transfer material W2, micropatterns which correspond to the transfer micropattern on the mold 1141 and are continuously connected to the micropatterns shown in FIG. 19 (b) are formed only on the lower transfer material W7. The substrate W1 is not etched by the etching described above. After the formation of the micropatterns on the lower transfer material W7, the upper transfer material is removed (see FIG. 20 (d)).

By etching the substrate W1 after the removal of the upper transfer material W2, a micropattern corresponding to the micropatterns on the lower transfer material W7 (the continuous transfer micropattern on the mold M1) is formed on the substrate W1 (see FIG. 20 (e)) and then the lower transfer material W7 is removed (see FIG. 20 (f)).

The micropattern forming method according to the second embodiment achieves the following effects in addition to the effects achieved by the micropattern forming method according to the first embodiment.

According to the micropattern forming method according to the second embodiment, micropatterns are formed on the lower transfer material W7 while shifting times in the first (first-group) micropattern forming step and the second (second-group) micropattern forming step. Thereafter, by etching the substrate W1 on which the lower transfer material W7 having the micropatterns is provided, the micropattern is formed on the substrate W1. Specifically, the formation of the micropattern on the substrate W1 by etching is performed not in stages but in one stage. Thus, the micropattern having a more accurate form can be formed on the substrate, such that concave portions of the micropattern formed on the substrate W1 have a uniform depth.

As the substrate W1, a glass substrate may be adopted. As the lower transfer material, silicon nitride, a thin film of metal such as chromium and aluminum or a resin such as an acrylic resin may be adopted. As the upper transfer material, a thermoplastic resin or a thermosetting resin may be adopted.

Note that the micropattern forming method according to the second embodiment is an example of a micropattern forming method for continuously forming micropatterns on a substrate, the micropatterns each corresponding to a transfer micropattern formed on a mold. The micropattern forming method includes: a covering step of covering a surface of a lower transfer material in the substrate with a film of an upper transfer material, the substrate having its surface covered with a thin film of the lower transfer material; a transfer step of transferring the transfer micropattern at predetermined intervals in a plurality of spots on the upper transfer material formed in the covering step by pressing the mold more than once (for example, at intervals slightly narrower than a width of the mold) against a part of the substrate having the thin film of the upper transfer material provided on its surface by the covering step; a micropattern forming step of forming the micropatterns at predetermined intervals in a plurality of spots on the lower transfer material by etching after the transfer of the micropatterns by the transfer step, the micropatterns each corresponding to the transfer micropattern on the mold; and a removal step of removing the transfer material provided in the covering step after the formation of the micropatterns by the micropattern forming step. The micropatterns each corresponding to the transfer micropattern formed on the mold are continuously formed on the lower transfer material by repeating a cycle of the covering step, the transfer step, the micropattern forming step and the removal step in this order for multiple times while accordingly changing positions to form micropatterns in the transfer step and the micropattern forming step. Thereafter, a micropattern corresponding to the micropatterns on the lower transfer material is formed on the substrate by etching after the formation of the micropatterns on the lower transfer material. Subsequently, micropatterns each corresponding to the transfer micropattern formed on the mold are continuously formed on the substrate by removing the lower transfer material after the formation of the micropattern on the substrate.

Third Embodiment

FIG. 21 is a view schematically showing steps of a micropattern forming method according to a third embodiment of the present invention.

The micropattern forming method according to the third embodiment is different from the micropattern forming method according to the first embodiment in that a substrate W1 is formed by stacking a first material W11 made of, for example, silicon, a second material W8 made of, for example, silicon dioxide, and a third material W9 made of, for example, silicon. The other points are approximately the same as the micropattern forming method according to the first embodiment.

To be more specific, in the micropattern forming method according to the third embodiment, first, a surface of the third material W9 in the substrate (SOI; silicon on insulator) W1 is covered with a thin film of a transfer material (for example, a ultraviolet curable resin) W10, the substrate W1 formed by stacking the plate-like first material (for example, Si; silicon) W11, the thin-film-like second material (for example, silicon oxide) W8, and the thin-film-like third material (for example, Si; the third material may be the same as or different from the first material W11).

Subsequently, a transfer micropattern is transferred onto the transfer material W10 by pressing a mold M1 against a part of the substrate W1 having a thin film of the transfer material W10 provided on its surface (see FIG. 21 (a)).

By etching after the transfer of the micropattern onto the transfer material W10, a micropattern corresponding to the transfer micropattern on the mold M1 is formed only on the third material W9. Thereafter, the transfer material W10 is removed (see FIG. 21 (b)).

After the removal of the transfer material W10, surface portions of the third material W9 where the micropatterns are formed and other surface portions of the third material W9, the other surface portions being connected to the above portions, (for example, approximately the entire surface of the third material W9) are covered with a thin film of the transfer material W10.

Thereafter, a transfer micropattern is transferred onto the transfer material W10 by pressing the mold M1 against other portions continuously connected to the portions having the micropatterns formed therein shown in FIG. 21 (b), the other portions being a part of the substrate W1 having the thin film of the transfer material W10 provided on its surface (see FIG. 21 (c)).

By etching after the transfer of the micropattern onto the transfer material W10, micropatterns which correspond to the transfer micropattern on the mold M1 and are continuously connected to the micropatterns shown in FIG. 21 (b) are formed only on the third material W9. Thereafter, the transfer material W10 is removed (see FIG. 21 (d)).

According to the micropattern forming method according to the third embodiment, in each micropattern forming step, the second material W8 in the substrate W1 is not etched in the formation of the micropatterns on the third material W9 by etching. Therefore, concave portions of the micropattern formed on the substrate W1 (the third material W9) have a uniform depth. Thus, the micropattern having a more accurate form can be formed on the substrate W1.

Note that the micropattern forming method according to the third embodiment is an example of a micropattern forming method for continuously forming micropatterns on a substrate, the micropatterns each corresponding to a transfer micropattern formed on a mold. The micropattern forming method includes: a covering step of covering a surface of a third material in the substrate with a thin film of a transfer material, the substrate being formed by stacking a first material, a thin-film-like second material and a thin-film-like third material; a transfer step of transferring the transfer micropatterns at predetermined intervals in a plurality of spots on the transfer material formed in the covering step by pressing the mold more than once against a part of the substrate having the thin film of the transfer material provided on its surface by the covering step; a micropattern forming step of forming the micropatterns at predetermined intervals in a plurality of spots only on the third material by etching after the transfer of the micropatterns by the transfer step, the micropatterns each corresponding to the transfer micropattern on the mold; and a removal step of removing the transfer material provided in the covering step after the formation of the micropatterns by the micropattern forming step. The micropatterns each corresponding to the transfer micropattern formed on the mold are continuously formed, on the substrate by repeating a cycle of the covering step, the transfer step, the micropattern forming step and the removal step in this order for multiple times while accordingly changing positions to form micropatterns in the transfer step and the micropattern forming step.

Fourth Embodiment

Figure 22:
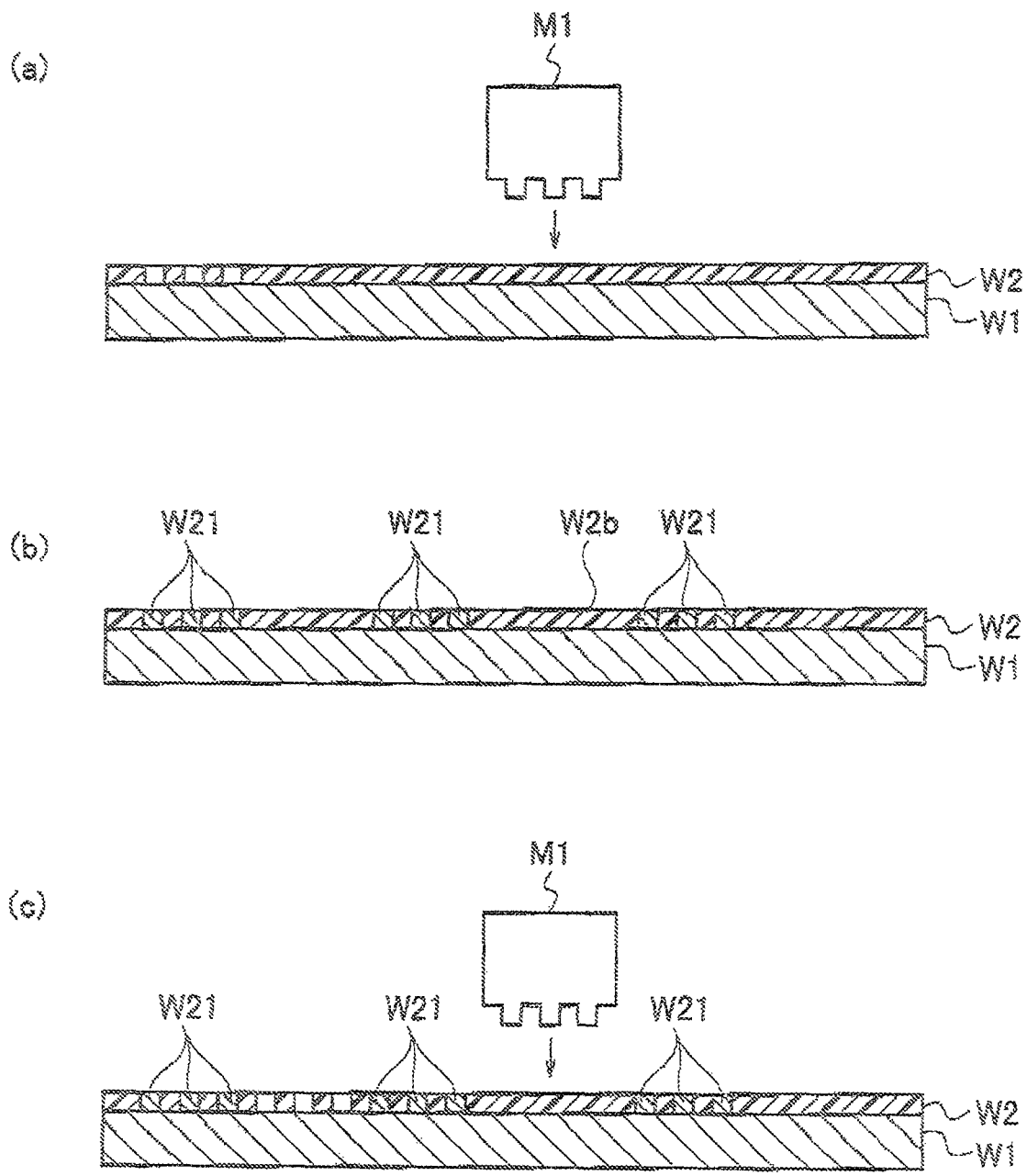
FIGS. 22 (a) to 22 (c) are views schematically showing steps of a micropattern forming, method according to a fourth embodiment of the present invention.
Figure 25:
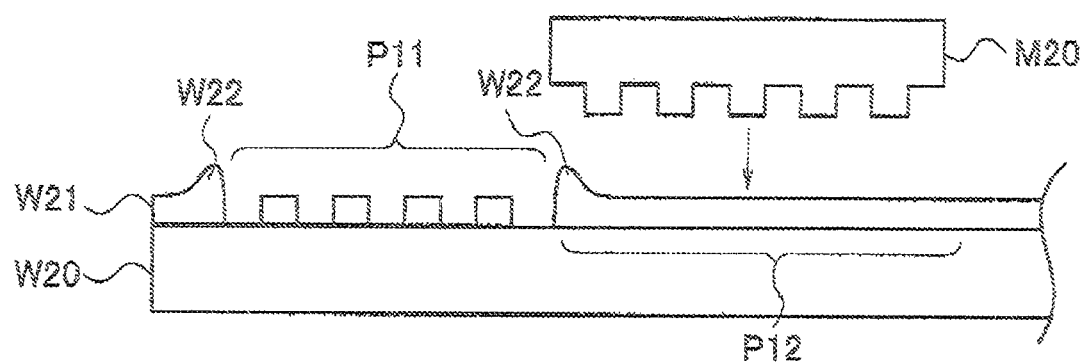
FIG. 25 is a view showing the conventional transfer method.

FIGS. 22 and 23 are views schematically showing steps of a micropattern forming method according to a fourth embodiment of the present invention.

The micropattern forming method according to the fourth embodiment is different from the micropattern forming method according to the first embodiment in the following points. In the micropattern forming method according to the fourth embodiment, a transfer material W2 is provided on a substrate W1, and a transfer micropattern on a mold M1 is transferred onto the transfer material W2. Thereafter, covering members W21 is provided at bottoms of concave portions in a micropattern formed by the above transfer and then the transfer material W2 is removed. These steps are repeated more than once, and then the substrate W1 is etched in a state where the covering members W21 are left on the substrate W1. Thereby, the transfer micropattern is formed on the substrate W1. The other points are approximately the same as the micropattern forming method according to the first embodiment.

To be more specific, in the micropattern forming method according to the fourth embodiment, first, a surface of the substrate W1 is covered with a film of the transfer material W2. Thereafter, a transfer micropattern is transferred onto the transfer material W2 by pressing the mold M1 against the transfer material W2 (see FIG. 22 (a)). In this state, there is a case where thin films of the transfer material W2 remain at bottoms of concave portions in the transfer material W2. In this case, the remaining films are removed, for example, by O2 ashing to expose the surface of the substrate W1 at the bottoms of the concave portions.

Subsequently, the covering members W21 are provided in portions (the bottoms of the concave portions in the transfer micropattern) where the substrate W1 is exposed by the transfer of the transfer micropattern. The covering members W21 are formed of members (for example, metal members) of a different kind from the transfer material W2. Moreover, the transfer material W21 is provided by plating or deposition (physical deposition such as vacuum deposition or chemical deposition may be used). The covering members W21 cover the bottoms of the concave portions in the transfer micropattern, the bottoms being the portions where the substrate W1 is exposed.

Incidentally, in the provision of the covering members W21, the covering members W21 may cover only the portions (the bottoms of the concave portions in the transfer micropattern) where the substrate W1 is exposed by the transfer of the transfer micropattern. However, in some actual cases, not only the covering members W21 are provided so as to fill all the concave portions in the transfer micropattern, but a surface W2b that is not the concave portions in the transfer micropattern may also be covered with the covering members W21. To leave the covering members W21 only in the concave portions in the transfer micropattern, the covering members W21 covering the surface W2b are cut off, for example, by machining such as cutting. Thus; as shown in FIG. 22 (b), the surface W2b of the transfer material W2 is exposed and the concave portions in the transfer micropattern are filled with the metal members W21.

After the portions where the substrate W1 is exposed are covered with the covering members W21 as shown in FIG. 22 (b), the transfer material W2 is removed. This removal is performed by use of, for example, a solvent which dissolves the transfer material W2 without dissolving the substrate W1 and the covering members W21.

Subsequently, surface portion of the substrate W1 (surface portion of the substrate W1 where the covering members W21 do not exist and the substrate W1 is exposed since only the covering members W21 are left on a flat surface of the substrate W1 by removal of the transfer material W2 and the covering members W21 form a micropattern) are covered with a film of the transfer material W2. A thickness of the transfer material W2 in this state is approximately equal to a thickness of the transfer material W2 provided in the first time (see FIG. 22 (a)) and a thickness of the covering members W21 in FIG. 22 (b).

Thereafter, a transfer micropattern is transferred onto the transfer material W2 by pressing the mold M1 against the substrate W1 having the film of the transfer material W2 provided on its surface (see FIG. 22 (c)). As described above, also in this state, there is a case where thin films of the transfer material W2 remain at bottoms of concave portions in the transfer material W2. In this case, the remaining films are removed, for example, by O2 aching to expose the surface of the substrate W1 at the bottoms of the concave portions.

Subsequently, as in the above case, portions where the substrate W1 is exposed by the transfer of the transfer micropattern are covered with the covering members W21 (see FIG. 23 (d)), and then the transfer material W2 is removed. Note that, in the state where the transfer material W2 is removed, a transfer micropattern of the covering members (provided by each covering step) W21 corresponding to the transfer micropattern on the mold M1 is formed on the flat surface of the substrate W1.

After the removal of the transfer material W2, a micropattern corresponding to the transfer micropattern on the mold M1 is formed on the surface of the substrate W1 by etching using the covering members W21 as a resist film (protective film) (see FIG. 23 (e)). After the formation of the micropattern, the covering members W21 are removed (see FIG. 23 (f)).

Accordingly, the micropatterns each corresponding to the transfer micropattern formed on the mold M1 are continuously formed on the substrate W1.

Note that the micropattern forming method according to the fourth embodiment is an example of a micropattern forming method for continuously forming micropatterns on a substrate, the micropatterns each corresponding to a transfer micropattern formed on a mold. The micropattern forming method includes: a covering step of covering a surface of the substrate with a film of a transfer material; a transfer step of transferring the transfer micropatterns at predetermined intervals in a plurality of spots on the transfer material formed in the covering step by pressing the mold more than once against the substrate having the film of the transfer material provided on its surface by the covering step; a provision step of providing a covering member in a portion where the substrate is exposed by the transfer of the transfer micropattern in the transfer step; and a removal step of removing the transfer material provided in the covering step after covering the portion where the substrate is exposed with the covering members in the provision step, the micropattern corresponding to the transfer micropattern on the mold is formed on the substrate by etching using the covering members W as a resist film after repeating the respective steps for multiple cycles in the order of the covering step, the transfer step, the provision step and the removal step. The micropatterns each corresponding to the transfer micropattern formed on the mold are continuously formed on the substrate by removing the covering members provided in the provision step after the formation of the micropattern.

The present invention is not limited to the above description of the embodiments of the invention but can be implemented in various other modes by making appropriate changes thereto.

Note that the entire contents of Japanese Patent Applications Nos. 2007-59016 (filed: Mar. 8, 2007) and 2008-8011 (tiled: Jan. 17, 2008) are incorporated herein by reference.

The invention claimed is:

1. A micropattern forming method for continuously forming micropatterns on a substrate, the micropatterns each corresponding to a transfer micropattern formed on a mold, the micropattern forming method comprising:

a first covering step of covering a surface of a third material in the substrate with a film of a transfer material, the substrate being formed by stacking a first material, a film of a second material and a film of a third material;

a first transfer step of transferring the transfer micropattern onto the transfer material formed in the first covering step by pressing the mold against the substrate having the film of the transfer material provided on its surface by the first covering step;

a first micropattern forming step of forming a micropattern on the third material by etching after the transfer of the micropattern by the first transfer step, the micropattern corresponding to the transfer micropattern on the mold;

a first removal step of removing the transfer material provided in the first covering step after the formation of the micropattern by the first micropattern forming step;

a second covering step of covering the surface of the third material with a film of the transfer material after the removal of the transfer material in the first removal step;

a second transfer step of transferring the transfer micropattern onto the transfer material formed in the second covering step by pressing a mold against the substrate having the film of the transfer material provided on its surface by the second covering step;

a second micropattern forming step of forming a micropattern on the third material by etching after the transfer of the micropattern by the second transfer step, the micropattern corresponding to the transfer micropattern on the mold; and a second removal step of removing the transfer material provided in the second covering step after the formation of the micropattern by the second micropattern forming step.

2. The micropattern forming method according to claim 1, further comprising:

a positional relationship detecting step of detecting a positional relationship between the micropattern formed in the first micropattern forming step and the transfer micropattern formed on the mold after the micropattern is formed in the first micropattern forming step and before the transfer is performed in the second transfer step; and a correction step of correcting a position of the mold relative to the substrate on the basis of a result of the detection in the positional relationship detecting step, so that the transfer micropattern to be formed in the second micropattern forming step is accurately connected to the micropattern formed in the first micropattern forming step.

3. The micropattern forming method according to claim 2, wherein the correction step is a step of performing the correction by compensating a change in shape of the mold to an accurate shape by using an actuator.

4. The micropattern forming method according to claim 2, wherein by the first transfer step and the first micropattern forming step, micropatterns are formed in a first portion of the transfer material and in a second portion away from the first portion by a predetermined distance;

by the second transfer step and the second micropattern forming step, a micropattern is formed in a third portion connecting the first and second portions; and the positional relationship detecting step is a step of detecting a positional relationship between the micropattern formed in the first micropattern forming step and the transfer micropattern formed on the mold by detecting a relative positional deviation amount of the transfer micropattern on the mold at a boundary between the first portion and the transfer micropattern formed on the mold and by detecting a relative positional deviation amount of the transfer micropattern on the mold at a boundary between the second portion and the transfer micropattern formed on the mold.

5. The micropattern forming method according to claim 4, wherein
a portion of the mold having the transfer micropattern formed therein is formed to have a rectangular planar shape;
by arranging the first portion, the third portion and the second portion in a straight line, a micropattern is formed within a rectangular area;
the positional relationship detecting step is a step of detecting, on one side in a width direction of the rectangular micropattern, a positional deviation amount of the transfer micropattern on the mold relative to the first portion at the boundary between the first portion and the transfer micropattern formed on the mold and a positional deviation amount of the transfer micropattern on the mold relative to the second portion at the boundary between the second portion and the transfer micropattern formed on the mold, and of detecting, on an other side in the width direction of the rectangular micropattern, a positional deviation amount of the transfer micropattern on the mold relative to the first portion at the boundary between the first portion and the transfer micropattern formed on the mold; and
the correction step is a step of performing the correction by compensating the dimension of the mold in the width direction by changing an elastic deformation amount of the mold in the width direction of the rectangular micropattern by using an actuator on the basis of the positional deviation amount on the other side in the width direction.

6. The micropattern forming method according to claim 1, further comprising:
a step of forming a die by use of a substrate including a micropattern formed by using the micropattern forming method, in which a portion of the mold having the micropattern formed therein is formed to be long by performing the transfer steps and the micropattern forming steps in alignment with each other; and
a third transfer step of transferring the micropattern on the die onto a to-be-molded object, wherein
the portion of the die having the micropattern formed therein is formed into a convex surface shape formed by using a part of a lateral surface of a cylinder in such a manner that a longitudinal direction of the portion is set as a circumferential direction of the cylinder; or
the portion of the die having the micropattern formed therein is formed into a convex surface shape formed by using a part of a lateral surface of an elliptic cylinder in such a manner that the longitudinal direction of the portion is set as a circumferential direction of the elliptic cylinder; and
the transfer is performed while moving a linear pressing portion of the convex surface against the to-be-molded object from one end to the other end of the convex surface.

7. The micropattern forming method according to claim 6, wherein
after the third transfer is performed, the die is moved in a width direction of the micropattern on the die relative to the to-be-molded object;
a die is manufactured by electroforming by use of a substrate including a micropattern formed by using the micropattern forming method; and
by a fourth transfer step of transferring the micropattern on the die manufactured by electroforming onto a to-be-molded object, the micropattern on the die is transferred onto the to-be-molded object in a manner connected in the width direction.

8. The micropattern forming method according to claim 6 for continuously forming a micropattern on the to-be-molded object, the micropattern corresponding to the micropattern formed on the die, the method further comprising:
a third covering step of covering a surface of the to-be-molded object with a film of a transfer material;
a fourth transfer step of transferring the transfer micropattern onto the transfer material formed in the third covering step by pressing the die against the to-be-molded object having the film of the transfer material provided on its surface by the third covering step;
a third micropattern forming step of forming a micropattern on the to-be-molded object by etching after the transfer of the micropattern by the fourth transfer step, the micropattern corresponding to the transfer micropattern on the die;
a third removal step of removing the transfer material provided in the third covering step after the formation of the micropattern by the third micropattern forming step;
a fourth covering step of covering the surface of the to-be-molded object with a film of the transfer material after the removal of the transfer material in the third removal step;
a fifth transfer step of transferring the transfer micropattern onto the transfer material formed in the fourth covering step by pressing the die against the to-be-molded object having the film of the transfer material provided on its surface by the fourth covering step;
a fourth micropattern forming step of forming a micropattern on the to-be-molded object by etching after the transfer of the micropattern by the fifth transfer step, the micropattern corresponding to the transfer micropattern on the mold; and
a fourth removal step of removing the transfer material provided in the fourth covering step after the formation of the micropattern by the fourth micropattern forming step.

9. The micropattern forming method according to claim 8, wherein
in each transfer step,
the portion of the die having the micropattern formed therein is formed into a convex surface shape formed by using a part of a lateral surface of a cylinder in such a manner that a longitudinal direction of the portion is set as a circumferential direction of the cylinder; or
the portion of the die having the micropattern formed therein is formed into a convex surface shape formed by using a part of a lateral surface of an elliptic cylinder in such a manner that the longitudinal direction of the portion is set as a circumferential direction of the elliptic cylinder; and
the transfer is performed while moving a linear pressing portion of the convex surface against the to-be-molded object from one end to the other end of the convex surface.

10. The micropattern forming method according to claim 1, wherein micropatterns are formed in portions of the substrate corresponding to portions of one color of a checkered pattern in the first transfer step and the first micropattern forming step, and micropatterns are formed in portions of the substrate corresponding to portions of the other color of the checkered pattern in the second transfer step and the second micropattern forming step.

11. A micropattern forming method for continuously forming micropatterns on a substrate, the micropatterns each corresponding to a transfer micropattern formed on a mold, the micropattern forming method comprising:

a covering step of covering a surface of a third material in the substrate with a film of a transfer material, the substrate being formed by stacking a first material, a film of a second material and a film of a third material;

a transfer step of transferring the transfer micropatterns at predetermined intervals in a plurality of spots on the transfer material formed in the covering step by pressing the mold more than once against the substrate having the film of the transfer material provided on its surface by the covering step;

a micropattern forming step of forming the micropatterns at predetermined intervals in a plurality of spots on the third material by etching after the transfer of the micropatterns by the transfer step, the micropatterns each corresponding to the transfer micropattern on the mold; and a removal step of removing the transfer material provided in the covering step after the formation of the micropatterns by the micropattern forming step, wherein the micropatterns each corresponding to the transfer micropattern formed on the mold are continuously formed on the substrate by repeating a cycle of the covering step, the transfer step, the micropattern forming step and the removal step in this order for multiple times.

* * * * *